(12) United States Patent
Chen et al.

(10) Patent No.: US 11,640,076 B2
(45) Date of Patent: May 2, 2023

(54) DISPLAY SUBSTRATE, DISPLAY DEVICE AND TEST METHOD OF DISPLAY SUBSTRATE

(71) Applicants: Hefei Xinsheng Optoelectronics Technology Co., Ltd., Anhui (CN); BOE Technology Group Co., Ltd., Beijing (CN)

(72) Inventors: Yuting Chen, Beijing (CN); Tong Yang, Beijing (CN); Suzhen Mu, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 155 days.

(21) Appl. No.: 16/767,472

(22) PCT Filed: Nov. 29, 2019

(86) PCT No.: PCT/CN2019/121997
§ 371 (c)(1),
(2) Date: May 27, 2020

(87) PCT Pub. No.: WO2020/134861
PCT Pub. Date: Jul. 2, 2020

(65) Prior Publication Data
US 2021/0247634 A1    Aug. 12, 2021

(30) Foreign Application Priority Data

Dec. 25, 2018  (CN) .......................... 201811591919.7

(51) Int. Cl.
*H01L 23/00* (2006.01)
*G02F 1/13* (2006.01)
(Continued)

(52) U.S. Cl.
CPC ............ *G02F 1/1309* (2013.01); *H01L 22/32* (2013.01); *H01L 27/124* (2013.01)

(58) Field of Classification Search
CPC ...... G02F 1/1309; H01L 22/32; H01L 27/124
(Continued)

(56) References Cited

U.S. PATENT DOCUMENTS

2006/0192585 A1*  8/2006  Chen ...................... G09G 3/006
                                                    324/760.01
2008/0061815 A1    3/2008  Chen et al.
(Continued)

FOREIGN PATENT DOCUMENTS

CN        101452123 A    6/2009
CN        101556383 A    10/2009
(Continued)

*Primary Examiner* — Ori Nadav
(74) *Attorney, Agent, or Firm* — Banner & Witcoff, Ltd.

(57) ABSTRACT

A display substrate, a display device and a test method of the display substrate are disclosed. The display substrate includes a display region and a peripheral region. The peripheral region includes: a first leading wire extending in a first direction and including a first end and a second end; a first test wire electrically connected with the first leading wire at a first position of the first test wire between the first end and the second end; the display region includes first signal wires of first group extending in a second direction, two first signal wires arranged outermost in the first direction among the first signal wires of first group are respectively connected with the first end and the second end, and remaining first signal wires among the first signal wires of first group are connected with the first leading wire between the first end and the second end.

19 Claims, 7 Drawing Sheets

(51) Int. Cl.
*H01L 21/66* (2006.01)
*H01L 27/12* (2006.01)

(58) Field of Classification Search
USPC .......................................................... 257/48
See application file for complete search history.

(56) References Cited

U.S. PATENT DOCUMENTS

2011/0018801 A1* 1/2011 Wang ................ G02F 1/133512
345/158
2018/0095313 A1* 4/2018 Cao ........................ G02F 1/1345

FOREIGN PATENT DOCUMENTS

| CN | 101661200 A | 3/2010 |
| CN | 101833910 A | 9/2010 |
| CN | 102540595 A | 7/2012 |

* cited by examiner

DISPLAY SUBSTRATE, DISPLAY DEVICE AND TEST METHOD OF DISPLAY SUBSTRATE

The application is a U.S. National Phase Entry of International Application No. PCT/CN2019/121997 filed on Nov. 29, 2019, designating the United States of America and claiming priority to Chinese Patent Application No. 201811591919.7 filed on Dec. 25, 2018. The present application claims priority to and the benefit of the above-identified applications and the above-identified applications are incorporated by reference herein in their entirety.

TECHNICAL FIELD

Embodiments of the present disclosure relate to a display substrate, a display device and a test method of the display substrate.

BACKGROUND

In order to improve the yield of a display device and reduce the production cost of the display device, a defect detection process and a repair process are performed in a plurality of key steps during the manufacture of the display device. The following is described by taking a liquid crystal display device as an example. A manufacturing method of the liquid crystal display device includes an array substrate manufacturing process, an opposite substrate manufacturing process, a liquid crystal cell manufacturing process and a liquid crystal module manufacturing process. For example, in order to improve the yield in a stage of the liquid crystal module manufacturing process and reduce the production cost in the stage of the liquid crystal module manufacturing process, after the liquid crystal cell is cut from a mother board (Q panel) (i.e., after the liquid crystal cell manufacturing process is completed), a detection (e.g., a defect detection) is performed on the liquid crystal cell to prevent a defective liquid crystal cell from entering the subsequent liquid crystal module manufacturing process as much as possible. Moreover, improving a defect detection rate in a cell test stage has a great impact on the production cost and the production yield in the stage of the liquid crystal module manufacturing process.

SUMMARY

At least one embodiment of the present disclosure provides a display substrate, the display substrate includes a display region and a peripheral region disposed outside the display region, the peripheral region is provided with a first leading wire extending in a first direction, and the first leading wire includes a first end and a second end; the peripheral region is further provided with a first test wire, the first test wire is electrically connected with the first leading wire at a first position of the first leading wire, and the first position is between the first end and the second end; and the display region includes a plurality of first signal wires of first group which extend in a second direction different from the first direction and which are parallel to each other, two first signal wires arranged outermost in the first direction among the plurality of first signal wires of first group are respectively connected with the first end and the second end, and remaining first signal wires among the plurality of first signal wires of first group are connected with the first leading wire between the first end and the second end.

For example, the first position is a resistance midpoint of the first leading wire between the first end and the second end.

For example, the first test wire is further electrically connected with the first leading wire at a second position of the first leading wire, and the second position is between the first end and the second end and different from the first position.

For example, the first position and the second position are respectively at a ⅓ resistance point and a ⅔ resistance point of the first leading wire between the first end and the second end.

For example, the display region further includes a plurality of second signal wires which extend in the first direction and which are parallel to each other; the plurality of second signal wires cross with and are insulated from the plurality of first signal wires of first group; and the first leading wire and the plurality of second signal wires are in a same layer.

For example, the first test wire includes a first portion extending in the second direction and a first extension portion other than the first portion, one end of the first portion is electrically connected with the first leading wire, and the other end of the first portion is electrically connected with the first extension portion; the first portion and the plurality of first signal wires of first group are in a same layer; and the first extension portion, the first leading wire and the plurality of second signal wires are in a same layer.

For example, the peripheral region includes a bonding region and an opposite region; the bonding region and the opposite region are respectively positioned at two sides of the display region along the second direction; and the first leading wire is in the opposite region.

For example, the bonding region includes a first test pad, one end of the first test wire is electrically connected with the first test pad, and the other end of the first test wire is electrically connected with the first leading wire at the first position.

For example, the bonding region includes a plurality of first signal pads of first group, and the plurality of first signal wires are connected with the plurality of first signal pads of first group in one-to-one correspondence.

For example, the peripheral region is further provided with a test control wire; the opposite region further includes a plurality of first group control switches, first terminals of the plurality of first group control switches are electrically connected with the plurality of first signal wires of first group in one-to-one correspondence, second terminals of the plurality of first group control switches are electrically connected with the first leading wire, and control terminals of the plurality of first group control switches are electrically connected with the test control wire.

For example, the opposite region is further provided with a second leading wire which extends in the first direction and which includes a third end and a fourth end; the peripheral region is further provided with a second test wire, the second test wire is electrically connected with the second leading wire at a third position of the second leading wire, and the third position is between the third end and the fourth end; and the display region further includes a plurality of first signal wires of second group which extend in the second direction and which are parallel to each other, two first signal wires arranged outermost in the first direction among the plurality of first signal wires of second group are respectively connected with the third end and the fourth end, and remaining first signal wires among the plurality of first signal wires of second group are connected with the second leading wire between the third end and the fourth end; and the bonding region further includes a second test pad, one end of the second test wire is electrically connected with the second test pad, and the other end of the second test wire is electrically connected with the second leading wire at the third position.

For example, the opposite region is further provided with a third leading wire which extends in the first direction and which includes a fifth end and a sixth end; the peripheral region is further provided with a third test wire, the third test wire is electrically connected with the third leading wire at a fourth position of the third leading wire, and the fourth position is between the fifth end and the sixth end; the display region further includes a plurality of first signal wires of third group which extend in the second direction and which are parallel to each other, two first signal wires arranged outermost in the first direction among the plurality of first signal wires of third group are respectively connected with the fifth end and the sixth end, and remaining first signal wires among the plurality of first signal wires of third group are connected with the third leading wire between the fifth end and the sixth end; and the bonding region further includes a third test pad, one end of the third test wire is electrically connected with the third test pad, and the other end of the third test wire is electrically connected with the third leading wire at the fourth position.

For example, the opposite region is provided with a control leading wire extending in the first direction, and the control leading wire includes a seventh end and an eighth end; the test control wire is connected with the control leading wire at a connection position which is included by the control leading wire and which is between the seventh end and the eighth end; two control switches arranged outermost in the first direction among the plurality of first group control switches are respectively connected with the seventh end and the eighth end, and remaining control switches among the plurality of first group control switches are connected with the control leading wire between the seventh end and the eighth end.

For example, the opposite region further includes a plurality of second group control switches, first terminals of the plurality of second group control switches are electrically connected with the plurality of first signal wires of second group in one-to-one correspondence, second terminals of the plurality of second group control switches are electrically connected with the second leading wire, and control terminals of the plurality of second group control switches are electrically connected with the test control wire; and the opposite region further includes a plurality of third group control switches, first terminals of the plurality of third group control switches are electrically connected with the plurality of first signal wires of third group in one-to-one correspondence, second terminals of the plurality of third group control switches are electrically connected with the third leading wires, and control terminals of the plurality of third group control switches are electrically connected with the test control wire.

For example, the bonding region is further provided with a control signal pad electrically connected with the test control wire; the first test pad and the second test pad are on one side of the display region in the first direction, and the third test pad and the control signal pad are on the other side of the display region in the first direction.

For example, a first resistance ratio, a second resistance ratio and a third resistance ratio are equal to each other; the first resistance ratio is a ratio of a resistance from the first end to the first position of the first leading wire to a resistance from the first position to the second end of the first leading wire; the second resistance ratio is a ratio of a resistance from the third end to the third position of the second leading wire to a resistance from the third position to the fourth end of the second leading wire; and the third resistance ratio is a ratio of a resistance from the fifth end to the fourth position of the third leading wire to a resistance from the fourth position to the sixth end of the third leading wire.

For example, the first position is a resistance midpoint between the first end and the second end of the first leading wire; the third position is a resistance midpoint between the third end and the fourth end of the second leading wire; and the fourth position is a resistance midpoint between the fifth end and the sixth end of the third leading wire.

For example, the plurality of first signal wires of first group, the plurality of first signal wires of second group and the plurality of first signal wires of third group are respectively configured for transmitting data signals for sub-pixels for displaying light of different colors.

For example, a resistance of the first test wire, a resistance of the second test wire and a resistance of the third test wire are equal to each other.

At least one embodiment of the present disclosure provides a display device including the display substrate as described above and a main control circuit electrically connected with the display substrate.

At least one embodiment of the present disclosure provides a test method of the above-mentioned display substrate, and the test method includes: applying a first signal to the plurality of first signal wires of first group via the first test wire and the first leading wire, and performing detection based on a display state of the display substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventors of the present disclosure have noticed that test wires of a current display substrate are designed such that the display substrate has brightness unevenness and/or color shift defects caused by the test wires (e.g., resistances and parasitic capacitances of the test wires) in a test process (e.g., a defect detection process). Therefore, inherent defects related to brightness and/or color shift existing in the display substrate are easily covered up by brightness difference and/or color shift caused by the design of the test wires of the display substrate, or a detection personnel and/or a detection device (e.g., an optical automatic detection device) tends to ignore defects related to brightness and/or color shift existing in display sub-pixels. This reduces a defect detection rate (i.e. a rate that the defect is found out) of the display substrate (in other words, this increases a rate that the defect is omitted), increases the waste of resources in subsequent processes, and thus increases the manufacturing cost of the display substrate and a display device including the display substrate.

The display substrate shown in FIG. 1 will be exemplarily described below.

Figure 1:
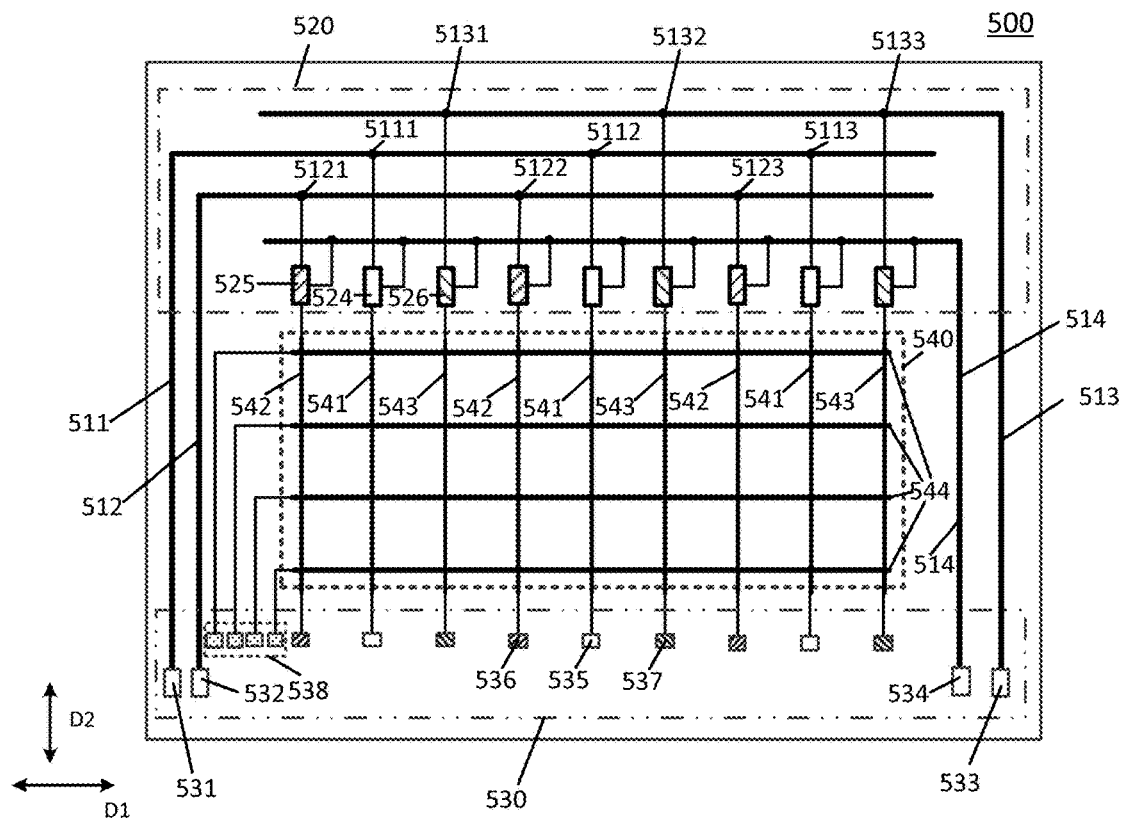
FIG. 1 is a schematic plan view of a display substrate according to one technique.

FIG. 1 shows a schematic plan view of a display substrate 500, which is, for example, a liquid crystal display substrate (e.g., an array substrate of a liquid crystal display panel) or a self-luminous display substrate (e.g., an array substrate of an organic light emitting diode display panel).

As shown in FIG. 1, the display substrate 500 includes a display region 540 and a peripheral region outside the display region 540 (e.g., the peripheral region is around the display region 540). The peripheral region includes a bonding region 530 and an opposite region 520 disposed opposite to the bonding region 530, the bonding region 530 and the opposite region 520 are respectively located on opposite sides of the display region 540 along a second direction D2 different from a first direction D1 (e.g., the bonding region 530 and the opposite region 520 are respectively located on a lower side and an upper side of the display region 540 in FIG. 1), the bonding region 530 extends along the first direction D1, and the opposite region 520 extends along the first direction D1.

As shown in FIG. 1, the display region 540 includes a plurality of first signal wires 541 of first group which extend in the second direction D2 and are arranged in parallel, a plurality of first signal wires 542 of second group which extend in the second direction D2 and are arranged in parallel, and a plurality of first signal wires 543 of third group which extend in the second direction D2 and are arranged in parallel. The plurality of first signal wires 541 of first group, the plurality of first signal wires 542 of second group and the plurality of first signal wires 543 of third group are respectively used for transmitting data signals for display sub-pixels for displaying light of different colors.

For example, the first signal wires are data wires. For example, the plurality of first signal wires 541 of first group are used for transmitting data signals for display sub-pixels for displaying green light, the plurality of first signal wires 542 of second group are used for transmitting data signals for display sub-pixels for displaying red light, and the plurality of first signal wires 543 of third group are used for transmitting data signals for display sub-pixels for displaying blue light.

As shown in FIG. 1, the display region 540 further includes a plurality of second signal wires 544 which extend in the first direction D1 and arranged in parallel, the plurality of second signal wires 544 intersect and are insulated from the plurality of first signal wires (i.e., the plurality of first signal wires 541 of first group, the plurality of first signal wires 542 of second group and the plurality of first signal wires 543 of third group), thereby defining a plurality of display sub-pixels arranged in an array. For example, the second signal wires 544 are gate wires, and the second signal wires 544 are used for transmitting scan signals.

For example, the display region 540 includes a plurality of display pixels (not shown in FIG. 1) arranged in an array, each display pixel includes a first display sub-pixel, a second display sub-pixel and a third display sub-pixel, and the first display sub-pixel, the second display sub-pixel and the third display sub-pixel are respectively electrically connected with the first signal wire 541 of first group, the first signal wire 542 of second group and the first signal wire 543 of third group, to emit light based on the data signals provided by the first signal wire 541 of first group, the first signal wire 542 of second group and the first signal wire 543 of third group. For example, the first display sub-pixel, the second display sub-pixel and the third display sub-pixel are used to display green light, red light and blue light, respectively.

As shown in FIG. 1, the bonding region 530 includes a plurality of first signal pads 535 of first group, a plurality of first signal pads 536 of second group and a plurality of first signal pads 537 of third group. The plurality of first signal wires 541 of first group are connected with the plurality of first signal pads 535 of first group in one-to-one correspondence. The plurality of first signal wires 542 of second group are connected with the plurality of first signal pads 536 of second group in one-to-one correspondence. The plurality of first signal wires 543 of third group are connected with the plurality of first signal pads 537 of third group in one-to-one correspondence. For example, the plurality of first signal pads 535 of first group, the plurality of first signal pads 536 of second group and the plurality of first signal pads 537 of third group are configured to be connected with a data driver through, for example, a flexible printed circuit board in a subsequent process to receive a plurality of data signals from the data driver and are configured to provide the plurality of data signals to corresponding first signal wires.

As shown in FIG. 1, the bonding region 530 further includes a plurality of second signal pads 538, and the plurality of second signal wires 544 are connected with the plurality of second signal pads 538 in one-to-one correspondence. For example, the plurality of second signal pads 538 are configured to be connected with a gate driver through, for example, a flexible printed circuit board in a subsequent process to receive a plurality of scan signals from the gate driver and are configured to provide the plurality of scan signals to the corresponding second signal wires 544.

As shown in FIG. 1, the bonding region 530 further includes a first test pad 531, a second test pad 532, a third test pad 533 and a control signal pad 534.

As shown in FIG. 1, the peripheral region is provided with a first test wire 511, a second test wire 512, a third test wire 513 and a test control wire 514, the first test wire 511 is connected with the first test pad 531 and includes a first portion extending in the first direction D1 in the opposite region 520, the second test wire 512 is connected with the second test pad 532 and includes a second portion extending in the first direction D1 in the opposite region 520, the third test wire 513 is connected with the third test pad 533 and includes a third portion extending in the first direction D1 in the opposite region 520, and the test control wire 514 is connected with the control signal pad 534 and includes a fourth portion extending in the first direction D1 in the opposite region 520.

For example, the bonding region 530 further includes a scan test pad (not shown in the figure), the peripheral region is further provided with a scan test wire (not shown in the figure), and two ends of the scan test wire are respectively electrically connected with the scan test pad and the second data wire.

As shown in FIG. 1, the opposite region 520 further includes a plurality of control switches 524 of first group, a plurality of control switches 525 of second group, and a plurality of control switches 526 of third group.

As shown in FIG. 1, first terminals of the plurality of control switches 524 of first group are electrically connected with the plurality of first signal wires 541 of first group in one-to-one correspondence, and second terminals of the plurality of control switches 524 of first group are electrically connected with the first portion of the first test wire 511; third terminals (i.e. control terminals) of the plurality of control switches 524 of first group are electrically connected with the fourth portion of the test control wire 514 to control the turning-on and turning-off of the plurality of control switches 524 of first group based on the control signal applied to the control signal pad 534, thereby controlling whether or not a first test data signal applied to the first test pad 531 is applied to the plurality of first signal wires 541 of first group via the first portion of the first test wire 511.

As shown in FIG. 1, first terminals of the plurality of control switches 525 of second group are electrically connected with the plurality of first signal wires 542 of second group in one-to-one correspondence, and second terminals of the plurality of control switches 525 of second group are electrically connected with the second portion of the second test wire 512; third terminals (i.e. control terminals) of the plurality of control switches 525 of second group are electrically connected with the fourth portion of the test control wire 514 to control the turning-on and turning-off of the plurality of control switches 525 of second group based on the control signal applied to the control signal pad 534, thereby controlling whether or not a second test data signal applied to the second test pad 532 is applied to the plurality of first signal wires 542 of second group via the second portion of the second test wire 512.

As shown in FIG. 1, first terminals of the plurality of control switches 526 of third group are electrically connected with the plurality of first signal wires 543 of third group in one-to-one correspondence, and second terminals of the plurality of control switches 526 of third group are electrically connected with the third portion of the third test wire 513; third terminals (i.e. control terminals) of the plurality of control switches 526 of third group are electrically connected with the fourth portion of the test control wire 514 to control the turning-on and turning-off of the plurality of control switches 526 of third group based on the control signal applied to the control signal pad 534, thereby controlling whether or not a third test data signal applied to the third test pad 533 is applied to the plurality of first signal wires 543 of third group via the third portion of the third test wire 513.

For example, in the case that a display device including the display substrate 500 shown in FIG. 1 performs normal display, an invalid signal is applied to the control signal pad 534 so that the control switches are turned off. For example, in the case that the control switches are N-type transistors, the invalid signal is a low level signal, or the control signal pad 534 is grounded or suspended. Turning off the control switches can prevent the first test wire 511, the second test wire 512 and the third test wire 513 from adversely affecting the display device.

For example, in testing the display substrate 500 (e.g., in a liquid crystal cell test process), a data signal is applied to at least one selected from the group consisting of the first test pad 531, the second test pad 532 and the third test pad 533, an effective signal (i.e., a level signal that enables the control switches to be turned on) is applied to the control signal pad 534 to turn on the control switches, so that the data signal applied to at least one selected from the group consisting of the first test pad 531, the second test pad 532 and the third test pad 533 is transmitted to the corresponding first signal wires (data wires). At the same time, a gate scan signal is applied to the scan signal pad, so that the data signal transmitted to corresponding first signal wires (data wires) is written into the display sub-pixels to drive the corresponding display sub-pixels to emit light.

For example, as shown in FIG. 1, the first test pad 531 and the second test pad 532 are located on one side of the display region 540 in the first direction D1, and the third test pad 533 and the control signal pad 534 are located on the other side of the display region 540 in the first direction D1. For example, as shown in FIG. 1, the first test wire 511 and the second test wire 512 extend from a lower left corner of the display substrate 500 to an upper right corner of the display substrate 500, and the third test wire 513 and the test control wire 514 extend from a lower right corner of the display substrate 500 to an upper left corner of the display substrate 500.

The inventors of the present disclosure have noticed that respectively setting the first test pad 531, the second test pad 532 and the third test pad 533 on two sides of the display region 540 in the first direction D1 can meet the wiring requirements (e.g., small wiring space) of a specific display substrate (e.g., a display substrate integrated with a gate driver), and can also increase the selection range of test equipment (e.g., lower requirements on the number of test signal channels of the test equipment).

However, the inventors of the present disclosure have noticed in the research that: with respect to the same test wire (for example, the first test wire 511, the second test wire 512 or the third test wire 513), due to the existence of, for example, resistance and parasitic capacitance of the test wire, there are differences in phase delay and signal amplitude (or voltage drop) of the signals at different positions of the test wire during a current flows through the test wire, thereby causing the display region 540 to have brightness differences at different positions at the same time, that is, the display region 540 has a defect of uneven brightness during the test of the display substrate. For example, in the case that the test data signal applied to the test pad changes, different phase delays of the signal at different positions of the test wire cause the brightness changes of the display sub-pixels at different positions of the display region 540 to be inconsistent with each other, for example, resulting in that the brightness of the display sub-pixels at certain positions of the display region 540 reaches the maximum brightness or the minimum brightness in advance or in delay. For example, different voltage drops of the signal at different positions of the test wire cause the brightness (i.e. brightness in a brightness stable state) of the display sub-pixels at different positions of the display region 540 to be inconsistent with each other.

In addition, with respect to the display substrate shown in FIG. 1, in the case where the test data signals are simultaneously applied to the plurality of test wires, due to differences in gradient direction of voltage drop (i.e. IR drop) of different test wires, the voltage drop of the first test wire 511 and the second test wire 512 gradually increases from left to right, while the voltage drop of the third test wire 513 gradually decreases from left to right. Therefore, the luminous intensities of the first display sub-pixel, the second display sub-pixel and the third display sub-pixel of the same display pixel of the display substrate 500 do not match with each other. For example, in the case that the first display sub-pixel, the second display sub-pixel and the third display sub-pixel of the same display pixel are respectively applied with data signals with a value of 255 (the value range from 0 to 255), the desired white light cannot be formed by mixing the green light emitted from the first display sub-pixel, the red light emitted from the second display sub-pixel, and the blue light emitted from the third display sub-pixel, thereby causing color shift in at least part of the display region 540 of the display substrate 500.

Next, an exemplary explanation will be made with reference to FIGS. 1, 2A, 2B, 3 and 4.

As shown in FIG. 1, the first portion of the first test wire 511 includes a first position 5111 of the first test wire 511, a second position 5112 of the first test wire 511, and a third position 5113 of the first test wire 511 sequentially arranged in the first direction D1. The second portion of the second test wire 512 includes a first position 5121 of the second test wire 512, a second position 5122 of the second test wire 512, and a third position 5123 of the second test wire 512 sequentially arranged in the first direction D1. The third portion of the third test wire 513 includes a first position 5131 of the third test wire 513, a second position 5132 of the third test wire 513, and a third position 5133 of the third test wire 513 sequentially arranged in the first direction D1.

Figure 2A:
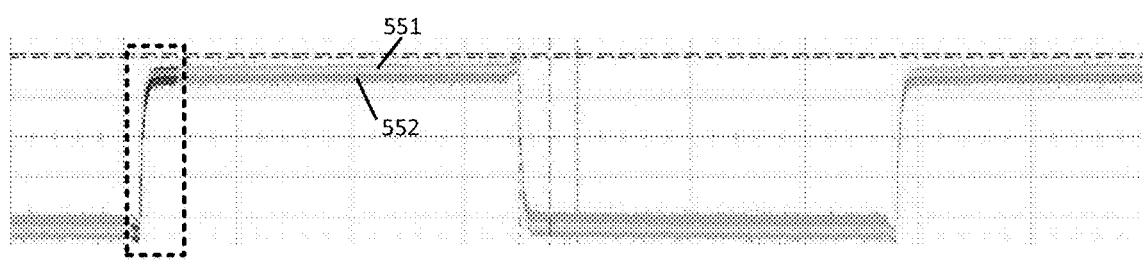
FIG. 2A is a test timing chart of voltage signals at a first position and a third position of a second test wire of the display substrate shown in FIG. 1.
Figure 2B:
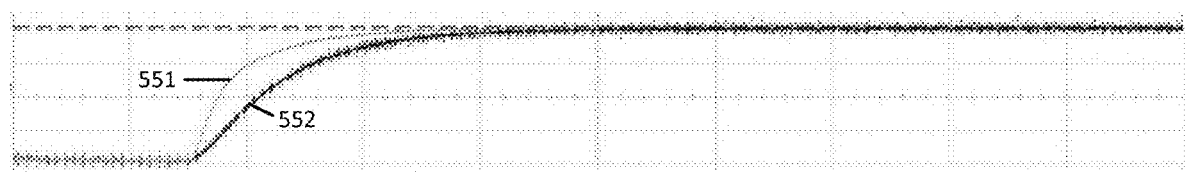
FIG. 2B is an enlarged view of the voltage signals of a partial region shown in FIG. 2A.

FIG. 2A shows a timing chart of a voltage signal 551 extracted from the first position 5121 of the second test wire 512 and a voltage signal 552 extracted from the third position 5123 of the second test wire 512 (time is represented in a transverse direction and voltage is represented in a longitudinal direction in FIG. 2A). FIG. 2B shows an enlarged view of a voltage signal (i.e., a rising edge of the voltage signal) of a local region (a dashed frame region in FIG. 2A) shown in FIG. 2A.

As shown in FIG. 2A, the amplitude of the voltage signal 551 extracted from the first position 5121 of the second test wire 512 is slightly larger than the amplitude of the voltage signal 552 extracted from the third position 5123 of the second test wire 512, which indicates that the voltage drop at the third position 5123 of the second test wire 512 is larger than the voltage drop at the first position 5121 of the second test wire 512; as shown in FIG. 2B, the steepness of the rising edge of the voltage signal 551 extracted from the first position 5121 of the second test wire 512 is greater than the steepness of the rising edge of the voltage signal 552 extracted from the third position 5123 of the second test wire 512, which indicates that the time delay of the voltage signal extracted from the third position 5123 of the second test wire 512 is larger than the time delay of the voltage signal extracted from the first position 5121 of the second test wire 512.

Figure 3:
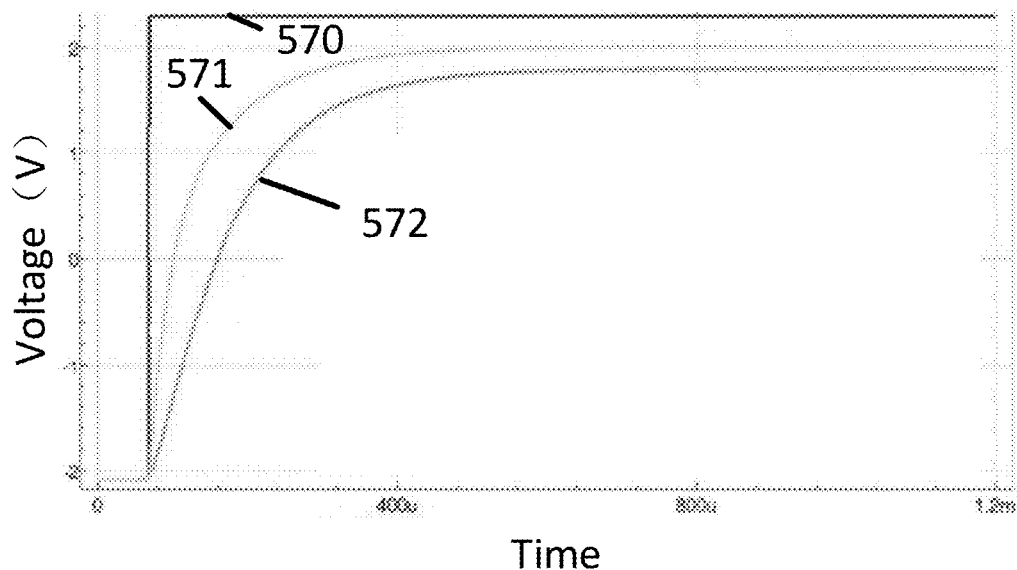
FIG. 3 is a simulation timing chart of the voltage signals at the first position and the third position of the second test wire of the display substrate shown in FIG. 1.

In order to more clearly show the difference in voltage drop and time delay between the first position 5121 of the second test wire 512 and the third position 5123 of the second test wire 512, the inventors of the present disclosure simulated the variation characteristics of the voltage signal extracted from the first position 5121 of the second test wire 512 and variation characteristics of the voltage signal extracted from the third position 5123 of the second test wire 512, and the simulation results are shown in FIG. 3. The transverse axis of FIG. 3 represents time, where u represents microseconds and m represents milliseconds.

As shown in FIG. 3, in the case that a square wave pulse 570 is applied to the second test pad 532, the steepness of the rising edge of a voltage signal 571 extracted from the first position 5121 of the second test wire 512 is greater than the steepness of the rising edge of a voltage signal 572 extracted from the third position 5123 of the second test wire 512, and the amplitude of the voltage signal 571 extracted from the first position 5121 of the second test wire 512 is larger than the amplitude of the voltage signal 572 extracted from the third position 5123 of the second test wire 512, which indicates that the voltage drop and the time delay at the third position 5123 of the second test wire 512 are both larger than the voltage drop and the time delay at the first position 5121 of the second test wire 512. For example, as shown in FIG. 3, the rise time of the voltage signal extracted from the first position 5121 of the second test wire 512 is about 162 microseconds, the rise time of the voltage signal extracted from the third position 5123 of the second test wire 512 is about 224 microseconds, and the difference between the amplitude of the voltage signal 571 extracted from the first position 5121 of the second test wire 512 and the amplitude of the voltage signal 572 extracted from the third position 5123 of the second test wire 512 is about 213 millivolts. For example, the signals extracted from the first test wire 511 and the signals extracted from the third test wire 513 have similar voltage drop characteristics and time delay characteristics as the second test wire 512, which will not be described here again.

Similarly, due to the influence of the resistance of the test wire, the voltage drop at the first position 5111 of the first test wire 511, the voltage drop at the second position 5112 of the first test wire 511, and the voltage drop at the third position 5113 of the first test wire 511 gradually increase, so the amplitude of the voltage signal extracted from the first position 5111 of the first test wire 511, the amplitude of the voltage signal extracted from the second position 5112 of the first test wire 511, and the amplitude of the voltage signal extracted from the third position 5113 of the first test wire 511 gradually decrease. The voltage drop at the first position 5131 of the third test wire 513, the voltage drop at the second position 5132 of the third test wire 513, and the voltage drop at the third position 5133 of the third test wire 513 gradually decrease, so that the voltage extracted from the first position 5131 of the third test wire 513, the voltage extracted from the second position 5132 of the third test wire 513, and the voltage extracted from the third position 5133 of the third test wire 513 gradually increase. Due to the influence of the capacitance of the test wire, the time delay of the voltage signal at the first position 5111 of the first test wire 511, the time delay of the voltage signal at the second position 5112 of the first test wire 511, and the time delay of the voltage signal at the third position 5113 of the first test wire 511 gradually increase; the time delay of the voltage signal at the first position 5131 of the third test wire 513, the time delay of the voltage signal at the second position 5132 of the third test wire 513, and the time delay of the voltage signal at the third position 5133 of the third test wire 513 gradually decrease.

For example, due to the uneven distribution (e.g., gradual decrease) of the signal amplitude of the test wire, the luminous brightness of the display sub-pixels is unevenly distributed (e.g., gradually decreased) along the first direction D1 in the test of the display substrate 500. An exemplary explanation will be given below with reference to FIG. 4.

Figure 4:
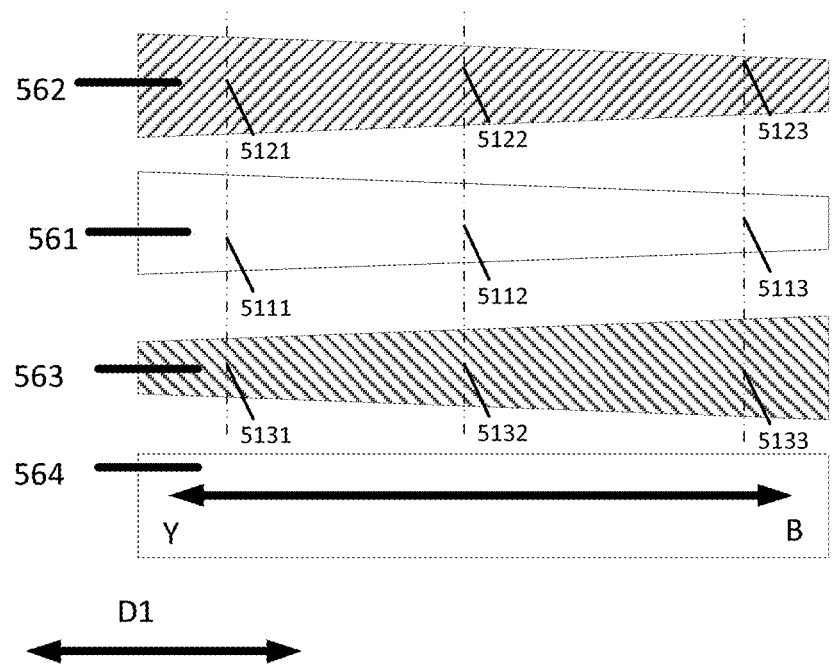
FIG. 4 illustrates brightness distribution diagrams of first display sub-pixels, second display sub-pixels and third display sub-pixels of the display substrate shown in FIG. 1 and a color distribution diagram of display pixels of the display substrate shown in FIG. 1.

FIG. 4 shows a brightness distribution map 561 of the first display sub-pixels in the first direction D1, a brightness distribution map 562 of the second display sub-pixels in the first direction D1, and a brightness distribution map 563 of the third display sub-pixels in the first direction D1, where the dimension of the brightness distribution map in the longitudinal direction indicates the brightness of the display sub-pixel corresponding to the brightness distribution map.

It should be noted that the brightness distribution diagram shown in FIG. 4 is obtained based on an ideal case that: if a plurality of display sub-pixels (e.g., first display sub-pixels) receive predetermined data signals (e.g., the received data signals are equal to each other), the plurality of display sub-pixels (e.g., first display sub-pixels) distributed in the first direction D1 have the same brightness.

As shown in FIG. 4, the brightness of the first display sub-pixel driven by the test data signal extracted from the first position 5111 of the first test wire 511 (i.e., the first display sub-pixel corresponding to the first position), the brightness of the first display sub-pixel driven by the test data signal extracted from the second position 5112 of the first test wire 511 (i.e., the first display sub-pixel corresponding to the second position), and the brightness of the first display sub-pixel driven by the test data signal extracted from the third position 5113 of the first test wire 511 (i.e., the first display sub-pixel corresponding to the third position) gradually decrease. The brightness of the second display sub-pixel driven by the test data signal extracted from the first position 5121 of the second test wire 512, the brightness of the second display sub-pixel driven by the test data signal extracted from the second position 5122 of the second test wire 512, and the brightness of the second display sub-pixel driven by the test data signal extracted from the third position 5123 of the second test wire 512 gradually decrease. The brightness of the third display sub-pixel driven by the test data signal extracted from the first position 5131 of the third test wire 513, the brightness of the third display sub-pixel driven by the test data signal extracted from the second position 5132 of the third test wire 513, and the brightness of the third display sub-pixel driven by the test data signal extracted from the third position 5133 of the third test wire 513 gradually increase.

For example, in the test of the display substrate 500, from the left side of the display region 540 to the right side of the display region 540, both the brightness of the first display sub-pixels and the brightness of the second display sub-pixels gradually decrease, but the brightness of the third display sub-pixels gradually increases. Therefore, the design of the test wires of the display substrate 500 shown in FIG. 1 leads to the defect of uneven brightness in the test of the display substrate 500 shown in FIG. 1.

FIG. 4 also shows a distribution 564 of colors displayed by the display substrate 500 along the first direction D1, assuming here that the first display sub-pixel, the second display sub-pixel and the third display sub-pixel respectively emit green light, red light and blue light.

As shown in FIG. 4, because the brightness of the red light and the green light of the display pixel corresponding to the first position of the display substrate 500 is greater than the brightness of the blue light of the display pixel corresponding to the first position of the display substrate 500, the color of mixed light of the display pixel corresponding to the first position is yellowish. As shown in FIG. 4, because the brightness of the red light and the green light of the display pixel corresponding to the third position of the display substrate 500 is smaller than the brightness of the blue light of the display pixel corresponding to the third position of the display substrate 500, the color of mixed light of the display pixel corresponding to the third position is bluish. Therefore, the design of the test wires of the display substrate 500 shown in FIG. 1 results in color shift defect in the test of the display substrate 500 shown in FIG. 1.

For example, the display substrate 500 shown in FIG. 1 has the brightness nonuniformity defect and/or the color shift defect caused by the design of the test wire during testing (e.g., defect detection), which may cause defects being related to brightness and being caused by other reasons in the display substrate are covered up by brightness difference and/or color shift caused by the design of the test wire of the display substrate 500, or a detection personnel and/or a detection device (e.g., optical automatic detection device) tends to ignore defects related to brightness and/or color shift existing in display substrate 500. This reduces the defect detection rate in the test of the display substrate (i.e., this increases the defect omission rate), increases the waste of resources in subsequent processes, and thus increases the manufacturing cost of the display substrate 500 and the display device including the display substrate 500. For example, in the case that the amplitude of the test data signal is weak, the brightness nonuniformity defect and/or color shift defect caused by the design of the test wire in the test (e.g., defect detection) of the display substrate 500 will be more obvious.

At least one embodiment of the present disclosure provides a display substrate, a display device, and a test method of the display substrate. The display substrate includes a display region and a peripheral region disposed outside the display region. The peripheral region is provided with a first leading wire extending in a first direction, and the first leading wire includes a first end and a second end; the peripheral region is further provided with a first test wire, the first test wire is electrically connected with the first leading wire at a first position of the first leading wire, and the first position is between the first end and the second end; the display region includes a plurality of first signal wires of first group extending in a second direction different from the first direction and being arranged in parallel, two first signal wires arranged outermost in the first direction among the plurality of first signal wires of first group are respectively connected with the first end and the second end, and remaining first signal wires among the plurality of first signal wires of first group are connected with the first leading wire between the first end and the second end.

In some examples, the display substrate as described above can reduce the brightness difference of the display substrate and improve the uniformity of the display brightness of the display substrate in the test process, thereby reducing the missed detection caused by the uneven brightness of the display substrate and improving the defect detection rate in the test stage of the display substrate.

In some examples, the display substrate as described above can also reduce the color shift of the display substrate in the test process, so that missed detection caused by the color shift of the display substrate is reduced, and the defect detection rate in the test stage of the display substrate is further improved.

The display substrate according to the embodiments of the present disclosure will be described below by way of several examples without limitation. As described below, different features in these specific examples can be combined with each other under the condition that they do not conflict with each other, so as to obtain new examples, which are also within the scope of protection of the present disclosure.

Figure 5:
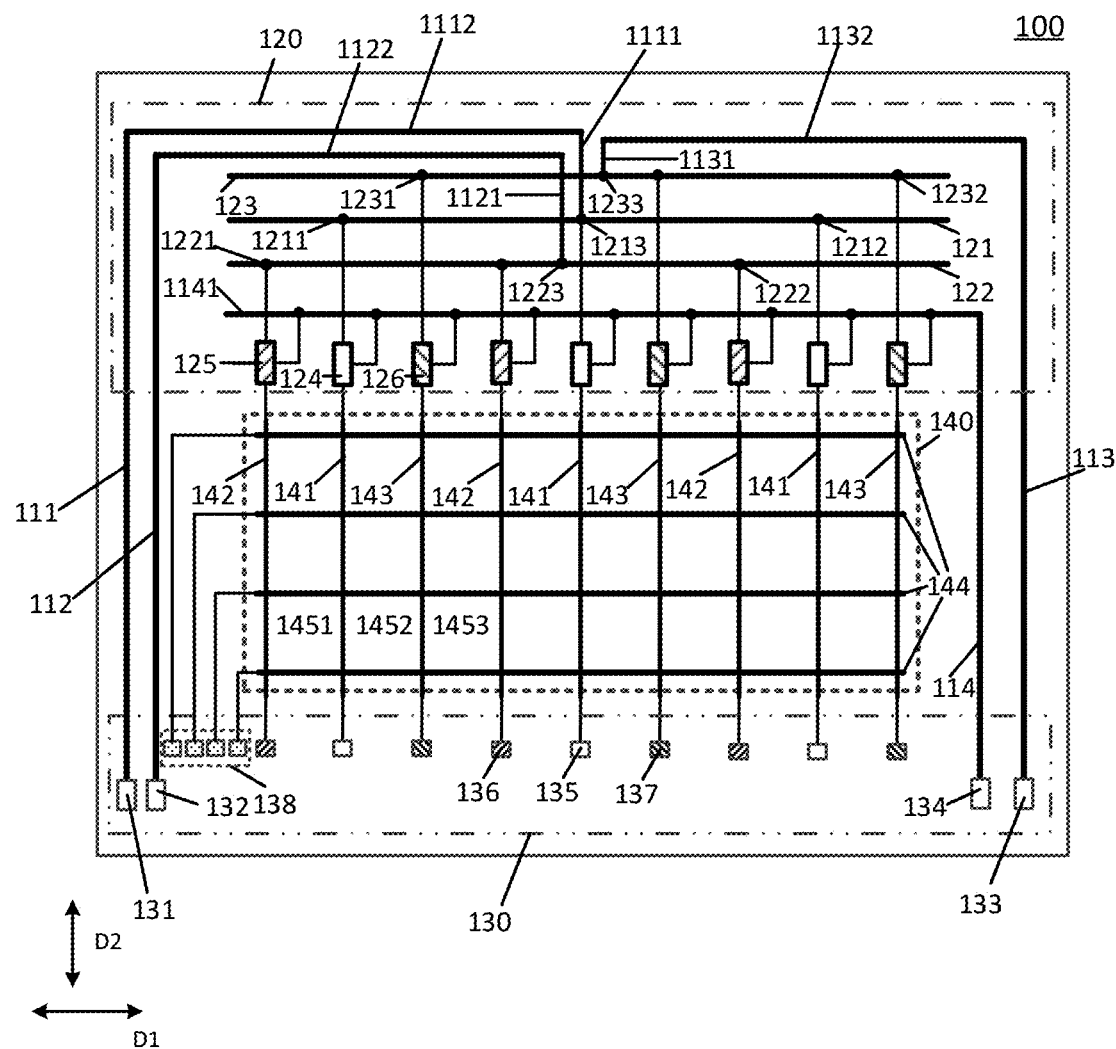
FIG. 5 is a schematic plan view of a display substrate provided by some embodiments of the present disclosure.

FIG. 5 shows a schematic plan view of the display substrate 100 provided by at least one embodiment of the present disclosure, which is, for example, a liquid crystal display substrate (e.g., an array substrate of a liquid crystal display panel) or a self-luminous display substrate (e.g., an array substrate of an organic light emitting diode (OLED) display panel). The display substrate is formed by a semiconductor preparation process and includes a laminated structure.

As shown in FIG. 5, the display substrate 100 includes the display region 140 and the peripheral region disposed outside the display region 140. The peripheral region is provided with the first leading wire 121 extending in the first direction D1, the first leading wire 121 includes the first end 1211 and the second end 1212; the peripheral region is further provided with the first test wire 111, the first test wire 111 is electrically connected with the first leading wire 121 at the first position 1213 of the first leading wire 121, and the first position 1213 is located between the first end 1211 and the second end 1212.

In some examples, by providing the first leading wire 121 extending along the first direction D1 and connecting the first test wire 111 to the first position 1213 of the first leading wire 121, the amplitude of the voltage signal of the first leading wire 121 is allowed to increase first and then decrease along the first direction D1, that is, the amplitude of the voltage signal at the first position 1213 of the first leading wire 121 is maximum, and the amplitude of the voltage signal gradually decreases from the first position 1213 to two sides of the first position 1213, so that the phase delay of the voltage signal of the first leading wire 121 decreases first and then increases along the first direction D1. Therefore, compared with the solution shown in FIG. 1 in which the amplitude and the signal delay of the voltage signal of the test wire in the display substrate 500 change monotonically along the first direction D1, the display substrate 100 shown in FIG. 5 reduces the difference in the amplitude and the phase delay of the voltage signal of the first leading wire 121, thus reduces the brightness difference of the display substrate 100 along the first direction D1 and improves the brightness uniformity of the display substrate 100, thereby reducing missed detection caused by the brightness nonuniformity of the display substrate 100 and improving the defect detection rate at the test stage of the display substrate. The display substrate 100 shown in FIG. 5 will be exemplarily described below.

As shown in FIG. 5, a second leading wire 122 is further provided in the peripheral region, the second leading wire 122 extends along the first direction D1 and includes a third end 1221 and a fourth end 1222; a second test wire 112 is further provided in the peripheral region, the second test wire 112 is electrically connected with the second leading wire 122 at a third position 1223 of the second leading wire 122, and the third position 1223 is located between the third end 1221 and the fourth end 1222.

As shown in FIG. 5, the peripheral region is further provided with a third leading wire 123, which extends along the first direction D1 and includes a fifth end 1231 and a sixth end 1232; the peripheral region is further provided with a third test wire 113, the third test wire 113 is electrically connected with the third leading wire 123 at a fourth position 1233 of the third leading wire 123, and the fourth position 1233 is located between the fifth end 1231 and the sixth end 1232.

The first end 1211 and the second end 1212 may or may be not physical ends of the first leading wire 121. In the latter case, although the first leading wire 121 may have an extension portion beyond the first end 1211 and the second end 1212, because this extension portion does not participate in the transmission of signals, the technical effect of the above wiring is not affected.

For example, in order to clearly show the display region 140, FIG. 5 exaggerates the distance between adjacent signal wires, so that the first end 1211 and the second end 1212 shown in FIG. 5 do not appear to be physical ends of the first leading wire 121. For example, in some practical products, the extension portion (e.g., hundreds of microns) located on the side of the first end 1211 away from the second end 1212 is negligible compared with the length (e.g., hundreds of millimeters) of the first leading wire 121; and thus, in some practical products, the first end 1211 and the second end 1212 serve as physical ends of the first leading wire 121. For example, in some practical products, the third end 1221 and the fourth end 1222 serve as physical ends of the second leading wire 122, and the fifth end 1231 and the sixth end 1232 serve as physical ends of the third leading wire 123.

In other examples, the first end 1211 and the second end 1212 are not physical ends of the first leading wire 121, the third end 1221 and the fourth end 1222 are not physical ends of the second leading wire 122, and the fifth end 1231 and the sixth end 1232 are not physical ends of the third leading wire 123. For the sake of clarity, this example will be described in detail later and will not be repeated here.

For example, the first leading wire 121, the second leading wire 122 and the third leading wire 123 are arranged in a same layer. In this case, for example, a same film is patterned by using a same patterning process to obtain the first leading wire 121, the second leading wire 122 and the third leading wire 123, thereby simplifying the manufacturing process of the display substrate 100. For example, being in the same layer involves being or being not located in a same horizontal plane. For example, the first leading wire 121, the second leading wire 122 and the third leading wire 123 being in the same layer means that there is no other layer between the first leading wire 121 and the second leading wire 122 in a direction perpendicular to the display substrate, there is no other layer between the first leading wire 121 and the third leading wire 123 in the direction perpendicular to the display substrate, and there is no other layer between the second leading wire 122 and the third leading wire 123 in the direction perpendicular to the display substrate. For example, being in the same layer in the embodiments of the present disclosure may have similar definitions, and will not be described again in the following.

In some examples, the first leading wire 121, the second leading wire 122 and the third leading wire 123 are located in at least two structural layers, respectively; for example, the first leading wire 121 and the second leading wire 122 are located in the same structural layer, and the third leading wire 123 is located in another structural layer. In some examples, the first leading wire 121, the second leading wire 122 and the third leading wire 123 are located in different structural layers, respectively; for example, the first leading wire 121 is located in a first structural layer, the second leading wire 122 is located in a second structural layer, and the third leading wire 123 is located in a third structural layer.

As shown in FIG. 5, the first test wire 111 includes a first portion 1111 extending in the second direction D2, and the first test wire 111 further includes a first extension portion 1112 which extends from a first test pad 131 to an end of the first portion 1111 and is connected with the end of the first portion 1111. The second test wire 112 includes a second portion 1121 extending in a second direction D2, and the second test wire 112 further includes a second extension portion 1122 which extends from a second test pad 132 to an end of the second portion 1121 and is connected with the end of the second portion 1121. The third test wire 113 includes a third portion 1131 extending in the second direction D2, and the third test wire 113 includes a third extension portion 1132 which extends from a third test pad 133 to an end of the third portion 1131 and is connected with the end of the third portion 1131.

For example, as shown in FIG. 5, the first portion 1111, the second portion 1121 and the third portion 1131 are in a same layer and parallel to each other. For example, the second portion 1121 and the third portion 1131 are respectively disposed on two sides of the first portion 1111 in the first direction D1. It should be noted that the distance (e.g., about several microns to several tens of microns) between the second portion 1121 and the first portion 1111 in the first direction D1 and the distance (e.g., about several microns to several tens of microns) between the third portion 1131 and the first portion 1111 in the first direction D1 are negligible compared with the length (e.g., about several hundred millimeters) of the leading wires (i.e. the first leading wire 121, the second leading wire 122 and the third leading wire 123) in the first direction D1. For example, the distance between the second portion 1121 and the first portion 1111 in the first direction D1 is equal to the distance between the third portion 1131 and the first portion 1111 in the first direction D1.

For example, if the first leading wire 121, the second leading wire 122 and the third leading wire 123 have a same length, a same width distribution (e.g., a same width), and a same thickness distribution (e.g., a same thickness), it can be considered that a ratio of a resistance between the first end 1211 and the first position 1213 of the first leading wire 121 to a resistance between the first position 1213 and the second end 1212 of the first leading wire 121 (i.e., a first resistance ratio), a ratio of a resistance between the third end 1221 and the third position 1223 of the second leading wire 122 to a resistance between the third position 1223 and the fourth end 1222 of the second leading wire 122 (i.e., a second resistance ratio), and a ratio of a resistance between the fifth end 1231 and the fourth position 1233 of the third leading wire 123 to a resistance between the fourth position 1233 and the sixth end 1232 of the third leading wire 123 (i.e., a third resistance ratio) are equal to each other.

For example, as shown in FIG. 5, the first extension portion 1112 of the first test wire 111 includes a first transverse extension portion and a first longitudinal extension portion that are connected with each other, the second extension portion 1122 of the second test wire 112 includes a second transverse extension portion and a second longitudinal extension portion that are connected with each other, and the third extension portion 1132 of the third test wire 113 includes a third transverse extension portion and a third longitudinal extension portion that are connected with each other. For example, as shown in FIG. 5, the first transverse extension portion, the second transverse extension portion and the third transverse extension portion respectively extend in the first direction D1, and the first longitudinal extension portion, the second longitudinal extension portion and the third longitudinal extension portion respectively extend in the second direction D2. It should be noted that the structures of the first extension portion 1112, the second extension portion 1122 and the third extension portion 1132 are not limited to the structures shown in FIG. 5 and will not be described in detail here. For example, the first extension portion 1112, the second extension portion 1122 and the third extension portion 1132 are disposed in a same layer.

For example, the first test wire 111, the second test wire 112 and the third test wire 113 are electrically insulated from each other. For example, each of the first test wire 111, the second test wire 112 and the third test wire 113 is made of metal (e.g., aluminum or aluminum alloy, copper or copper alloy, etc.) to reduce the resistances of the first test wire 111, the second test wire 112 and the third test wire 113 and thus reduce the voltage drop caused by the first test wire 111, the second test wire 112 and the third test wire 113.

As shown in FIG. 5, the peripheral region includes a bonding region 130 and an opposite region 120 which is opposite to the bonding region. The bonding region 130 and the opposite region 120 are respectively located on opposite sides of the display region 140 along the second direction D2 different from the first direction D1, and each of the bonding region 130 and the opposite region 120 extends along the first direction D1. For example, the first direction D1 and the second direction D2 are perpendicular to each other.

As shown in FIG. 5, the first leading wire 121, the second leading wire 122 and the third leading wire 123 are disposed in the opposite region 120. Hereinafter, the embodiments of the present disclosure will be exemplarily described with the example that the first leading wire 121, the second leading wire 122 and the third leading wire 123 are disposed in the opposite region 120, but the embodiments of the present disclosure are not limited thereto.

As shown in FIG. 5, the display region 140 includes a plurality of first signal wires 141 of first group extending in the second direction D2 and being arranged in parallel, a plurality of first signal wires 142 of second group extending in the second direction D2 and being arranged in parallel, and a plurality of first signal wires 143 of third group extending in the second direction and being arranged in parallel.

As shown in FIG. 5, two outermost first signal wires among the plurality of first signal wires 141 of first group in the first direction D1 are connected with the first end 1211 and the second end 1212, respectively, and the remaining first signal wires among the plurality of first signal wires 141 of first group are connected with the first leading wire 121 between the first end 1211 and the second end 1212. In this case, the first end 1211 and the second end 1212 refer to positions of the first leading wire 121 where the first leading wire 121 is connected with the two outermost first signal wires among the plurality of first signal wires 141 of first group in the first direction D1. The first end 1211 and the second end 1212 may be physical ends of the first leading wire 121 or may be not physical ends of the first leading wire 121.

As shown in FIG. 5, two outermost first signal wires among the plurality of first signal wires 142 of second group in the first direction D1 are connected with the third end 1221 and the fourth end 1222, respectively, and the remaining first signal wires among the plurality of first signal wires 142 of second group are connected with the second leading wire 122 between the third end 1221 and the fourth end 1222. In this case, the third end 1221 and the fourth end 1222 refer to positions of the second leading wire 122 where the second leading wire 122 is connected with the two outermost first signal wires among the plurality of first signal wires 142 of second group in the first direction D1. The third end 1221 and the fourth end 1222 may be physical ends of the second leading wire 122 or may be not physical ends of the second leading wire 122.

As shown in FIG. 5, two outermost first signal wires among the plurality of first signal wires 143 of third group in the first direction D1 are connected with the fifth end 1231 and the sixth end 1232 respectively, and the remaining first signal wires among the plurality of first signal wires 143 of third group are connected with the third leading wire 123 between the fifth end 1231 and the sixth end 1232. In this case, the fifth end 1231 and the sixth end 1232 refer to positions of the third leading wire 123 where the third leading wire 123 is connected with the two outermost first signal wires among the plurality of first signal wires 143 of third group in the first direction D1. The fifth end 1231 and the sixth end 1232 may be physical ends of the third leading wire 123 or may be not physical ends of the third leading wire 123.

For example, for three adjacent wires of the first signal wire 141 of first group, the first signal wire 142 of second group and the first signal wire 143 of third group, a connection position where the first signal wire 142 of second group is connected with the second leading wire 122, a connection position where the first signal wire 141 of first group is connected with the first leading wire 121, and a connection position where the first signal wire 143 of third group is connected with the third leading wire 123 are sequentially arranged in the first direction D1 and are immediately adjacent to each other, that is, no other connection position where the leading wire is connected with the first signal wire is between any two of the three connection positions. For example, the distance between the connection position where the first signal wire 141 of first group is connected with the first leading wire 121 and the connection position where the first signal wire 142 of second group is connected with the second leading wire 122 is negligible compared with the lengths of the leading wires 121-123; the distance between the connection position where the first signal wire 141 of first group is connected with the first leading wire 121 and the connection position where the first signal wire 143 of third group is connected with the third leading wire 123 is negligible compared with the lengths of the leading wires 121-123. Thus, the data signals received by the three adjacent wires of the first signal wire 141 of first group, the first signal wire 142 of second group and the first signal wire 143 of third group are matched with each other. For example, the distance between the connection position where the first signal wire 141 of first group is connected with the first leading wire 121 and the connection position where the first signal wire 142 of second group is connected with the second leading wire 122 is equal to the distance between the connection position where the first signal wire 141 of first group is connected with the first leading wire 121 and the connection position where the first signal wire 143 of third group is connected with the third leading wire 123. For example, the data signals received by the three adjacent wires of the first signal wire 141 of first group, the first signal wire 142 of second group and the first signal wire 143 of third group are respectively transmitted to the first display sub-pixel, the second display sub-pixel and the third display sub-pixel which are in the same display pixel, whereby the data signals received by the first display sub-pixel, the second display sub-pixel and the third display sub-pixel are matched with each other, and the light emitted by the first display sub-pixel, the light emitted by the second display sub-pixel and the light emitted by the third display sub-pixel are mixed into white light. For example, each of the leading wires is an electrically conductive structure extending with uniform thickness and uniform width.

For example, the plurality of first signal wires are data wires; the plurality of first signal wires 141 of first group, the plurality of first signal wires 142 of second group and the plurality of first signal wires 143 of third group are respectively used for transmitting data signals for sub-pixels for displaying light of different colors. For example, the plurality of first signal wires 141 of first group are used for transmitting data signals for sub-pixels for displaying green light, the plurality of first signal wires 142 of second group are used for transmitting data signals for sub-pixels for displaying red light, and the plurality of first signal wires 143 of third group are used for transmitting data signals for sub-pixels for displaying blue light.

As shown in FIG. 5, the display region 140 further includes a plurality of second signal wires 144 extending in the first direction D1 and being arranged in parallel, the plurality of second signal wires 144 are insulated from the plurality of first signal wires, and the plurality of second signal wires 144 cross with the plurality of first signal wires to define the plurality of display sub-pixels arranged in an array. For example, the second signal wires 144 are gate wires; the plurality of second signal wires 144 are used for transmitting scan signals. For example, an insulating layer is provided between a structural layer where the plurality of first signal wires are located and a structural layer where the plurality of second signal wires 144 are located. For example, each display sub-pixel includes a pixel driving circuit, which for example includes components such as a transistor, a capacitor, etc. In the case where the display substrate is a self-luminous display substrate, each display sub-pixel, for example, further includes a light emitter.

For example, the display region 140 includes the plurality of display pixels (not shown in FIG. 5) arranged in an array, each display pixel includes a first display sub-pixel 1451, a second display sub-pixel 1452 and a third display sub-pixel 1453, and the first display sub-pixel 1451, the second display sub-pixel 1452 and the third display sub-pixel 1453 are electrically connected with the first signal wire 141 of first group, the first signal wire 142 of second group and the first signal wire 143 of third group, respectively, to emit light based on data signals provided by the first signal wire 141 of first group, the first signal wire 142 of second group and the first signal wire 143 of third group. For example, the first display sub-pixel 1451, the second display sub-pixel 1452 and the third display sub-pixel 1453 are used to emit green light, red light and blue light, respectively.

It should be noted that the arrangement of the first display sub-pixel 1451, the second display sub-pixel 1452 and the third display sub-pixel 1453 may be set according to actual application requirements. For example, the arrangement of the first display sub-pixel 1451, the second display sub-pixel 1452 and the third display sub-pixel 1453 adopts an island type arrangement, a stipe type arrangement, a delta type arrangement, or a mosaic type arrangement. The arrangement of the signal wires are adaptively adjusted according to the arrangement of the first display sub-pixel 1451, the second display sub-pixel 1452 and the third display sub-pixel 1453 on the basis of the arrangement of the signal wires shown in FIG. 5, which will not be repeated here.

Figure 11:
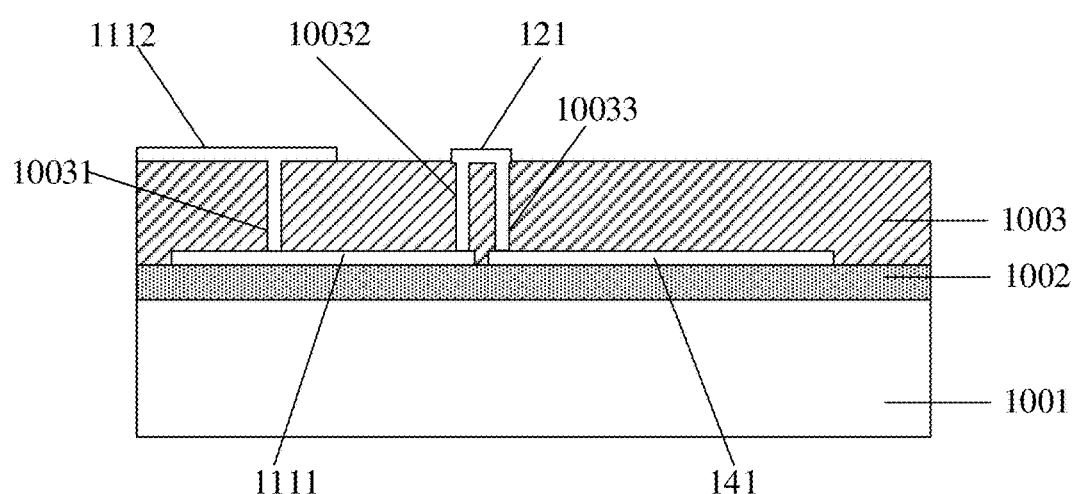
FIG. 11 is a sectional view of the display substrate shown in FIG. 5.

For example, the first portion 1111, the second portion 1121 and the third portion 1131 are disposed in the same layer as the first signal wires, and the first extension portion 1112 of the first test wire 111, the second extension portion 1122 of the second test wire 112, the third extension portion 1132 of the third test wire 113, the first leading wire 121, the second leading wire 122 and the third leading wire 123 are disposed in the same layer as the second signal wires 144, whereby the manufacturing process of the display substrate 100 is further simplified. In this case, the first extension portion 1112 of the first test wire 111, the second extension portion 1122 of the second test wire 112 and the third extension portion 1132 of the third test wire 113 are respectively connected with the first portion 1111, the second portion 1121 and the third portion 1131 via through holes. The first portion 1111, the second portion 1121 and the third portion 1131 are respectively connected with the first leading wire 121, the second leading wire 122 and the third leading wire 123 via through holes, and the first signal wires are respectively connected with the first leading wire 121, the second leading wire 122 and the third leading wire 123 via through holes. As an example, FIG. 11 shows the connection manner between the first extension portion 1112 of the first test wire 111, the first portion 1111 of the first test wire 111, the first leading wire 121 and the first signal wires 141 of first group. FIG. 11 is a cross-sectional view taken along the wiring paths of the first extension portion 1112 of the first test wire 111, the first portion 1111 of the first test wire 111, the first leading wire 121 and the first signal wires 141 of first group. As shown in FIG. 11, the display substrate 100 includes a base substrate 1001; on the base substrate 1001, the first portion 1111 of the first test wire 111 and the first signal wires 141 of first group are disposed in the same layer, the first extension portion 1112 of the first test wire 111 and the first leading wire 121 are disposed in the same layer, the first portion 1111 of the first test wire 111 and the first signal wires 141 of first group are insulated from the first extension portion 1112 of the first test wire 111 and the first leading wire 121 by means of an insulating layer 1003; the first extension portion 1112 of the first test wire 111 is connected with the first portion 1111 of the first test wire 111 through a first via 10031, the first portion 1111 of the first test wire 111 is connected with the first leading wire 121 through a second through hole 10032, and the first leading wire 121 is connected with the first signal wires 141 of first group through a third through hole 10033; the first through hole 10031, the second through hole 10032 and the third through hole 10033 all penetrate through the insulating layer 1003 and are conductive through holes. For example, the first portion 1111 of the first test wire 111 and the first signal wires 141 of first group are insulated from the base substrate 1001 by means of an insulating layer 1002; however, the embodiments of the present disclosure are not limited to this. For example, the first portion 1111 of the first test wire 111 and the first signal wires 141 of first group are directly formed on the base substrate 1001 without providing the insulating layer 1002. In FIG. 11, the first extension portion 1112 of the first test wire 111 and the first leading wire 121 are located on an upper side of the first portion 1111 of the first test wire 111 and the first signal wires 141 of first group; however, the embodiments of the present disclosure are not limited to this, and for example, the first portion 1111 of the first test wire 111 and the first signal wires 141 of first group are disposed on an upper side of the first extension portion 1112 of the first test wire 111 and the first leading wire 121. For example, the second extension portion 1122 of the second test wire 112, the second portion 1121 of the second test wire 112, the second leading wire 122 and the first signal wires 142 of second group are connected in a manner similar to FIG. 11. For example, the third extension portion 1132 of the third test wire 113, the third portion 1131 of the third test wire 113, the third leading wire 123 and the first signal wires 143 of third group are connected in a manner similar to FIG. 11.

Figure 12:
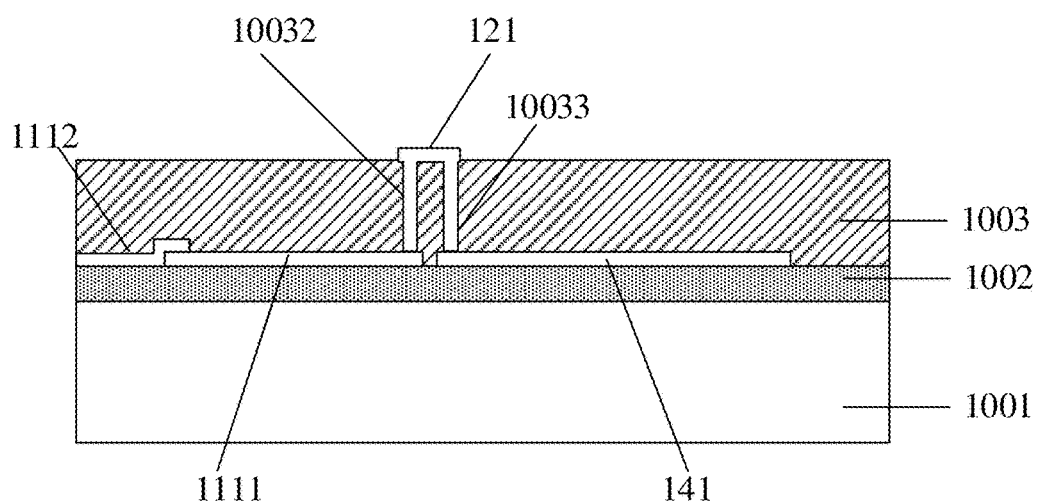
FIG. 12 is another sectional view of the display substrate shown in FIG. 5.

In some examples, the first extension portion 1112 of the first test wire 111, the second extension portion 1122 of the second test wire 112, and the third extension portion 1132 of the third test wire 113 are disposed in the same layer as the first portion 1111, the second portion 1121, the third portion 1131 and the first signal wires. In this case, the first extension portion 1112 of the first test wire 111, the second extension portion 1122 of the second test wire 112 and the third extension portion 1132 of the third test wire 113 are respectively electrically connected with the first portion 1111, the second portion 1121 and the third portion 1131 by means of directly overlapping each other without providing through holes, the first portion 1111, the second portion 1121 and the third portion 1131 are respectively connected with the first leading wire 121, the second leading wire 122 and the third leading wire 123 via through holes, and the first signal wires are respectively connected with the first leading wire 121, the second leading wire 122 and the third leading wire 123 via through holes. FIG. 12 is another cross-sectional view taken along the wiring paths of the first extension portion 1112 of the first test wire 111, the first portion 1111 of the first test wire 111, the first leading wire 121 and the first signal wires 141 of first group. As shown in FIG. 12, the first extension portion 1112 of the first test wire 111 overlaps and directly connects with the first portion 1111 of the first test wire 111, so that the first through hole 10031 shown in FIG. 11 does not need to be provided at all; in addition, the other structures of FIG. 12 are the same as those of FIG. 11 and will not be described here. For example, the second extension portion 1122 of the second test wire 112 overlaps and directly connects with the second portion 1121 of the second test wire 112 in a manner similar to FIG. 12. For example, the third extension portion 1132 of the third test wire 113 overlaps and directly connects with the third portion 1131 of the third test wire 113 in a manner similar to FIG. 12.

As shown in FIG. 5, the bonding region 130 further includes a plurality of first signal pads 135 of first group, a plurality of first signal pads 136 of second group and a plurality of first signal pads 137 of third group. The plurality of first signal wires 141 of first group are connected with the plurality of first signal pads 135 of first group in one-to-one correspondence. The plurality of first signal wires 142 of second group are connected with the plurality of first signal pads 136 of second group in one-to-one correspondence. The plurality of first signal wires 143 of third group are connected with the plurality of first signal pads 137 of third group in one-to-one correspondence. For example, the plurality of first signal pads 135 of first group, the plurality of first signal pads 136 of second group and the plurality of first signal pads 137 of third group are connected with a data driver through, for example, a flexible printed circuit board in a subsequent process so as to receive a plurality of data signals from the data driver and then provide the plurality of data signals to the corresponding first signal wires.

As shown in FIG. 5, the bonding region 130 further includes a plurality of second signal pads 138, and the plurality of second signal wires 144 are connected with the plurality of second signal pads 138 in one-to-one correspondence. For example, the plurality of second signal pads 138 are connected with a gate driver through, for example, a flexible printed circuit board in a subsequent process so as to receive a plurality of scan signals from the gate driver and then provide the plurality of scan signals to the corresponding second signal wires 144. In other embodiments, a gate driver circuit (i.e., GOA) is integrated in the display substrate, and accordingly, the bonding region 130 further includes signal pads for providing a scan start signal (STV), a clock signal, etc. to the gate driver circuit.

For example, the bonding region 130 is not provided with the first signal pads 135 to 137 and the second signal pads 138. In this case, for example, a plurality of wires are respectively connected with the first signal wires and the second signal wires, and then the plurality of wires are respectively connected with the gate driver and the data driver in a subsequent process.

As shown in FIG. 5, the bonding region 130 further includes a first test pad 131, a second test pad 132 and a third test pad 133 which are to be connected with test probes to receive corresponding test data signals during the test. For example, the bonding region 130 further includes scan signal test pads (not shown).

As shown in FIG. 5, one end of the first test wire 111 is electrically connected with the first test pad 131 and the other end of the first test wire 111 is electrically connected with the first position 1213, whereby a first test data signal applied to the first test pad 131 is applied to the plurality of first signal wires 141 of first group via the first test wire 111 and the first leading wire 121. One end of the second test wire 112 is electrically connected with the second test pad 132 and the other end of the second test wire 112 is electrically connected with the third position 1223, whereby a second test data signal applied to the second test pad 132 is applied to the plurality of first signal wires 142 of second group via the second test wire 112 and the second leading wire 122. One end of the third test wire 113 is electrically connected with the third test pad 133 and the other end of the third test wire 113 is electrically connected with the fourth position 1233, whereby a third test data signal applied to the third test pad 133 is applied to the plurality of first signal wires 143 of third group via the third test wire 113 and the third leading wire 123.

For example, an overall resistance of the first test wire 111, an overall resistance of the second test wire 112 and an overall resistance of the third test wire 113 are equal to each other, thereby the voltage drop caused by the first test wire 111, the voltage drop caused by the second test wire 112 and the voltage drop caused by the third test wire 113 are equal to each other. For example, in the case that the widths, thicknesses and fabrication materials of the first test wire 111, the second test wire 112 and the third test wire 113 are the same, the lengths of the first test wire 111, the second test wire 112 and the third test wire 113 are also the same. For example, the amplitude of the first test data signal applied to the first test pad 131, the amplitude of the second test data signal applied to the second test pad 132 and the amplitude of the third test data signal applied to the third test pad 133 are equal to each other; because the voltage drop caused by the first test wire 111, the voltage drop caused by the second test wire 112 and the voltage drop caused by the third test wire 113 are equal to each other, the amplitude of the data signal at the first position 1213, the amplitude of the data signal at the third position 1223 and the amplitude of the data signal at the fourth position 1233 are equal to each other In other examples, the first test wire 111, the second test wire 112 and the third test wire 113 are not equal to each other in the overall resistance and length. In this case, the voltage drop difference among the first test wire 111, the second test wire 112 and the third test wire 113 is acquired based on the resistance difference among the first test wire 111, the second test wire 112 and the third test wire 113, and then the first test data signal that has been corrected, the second test data signal that has been corrected and the third test data signal that has been corrected are acquired based on the voltage drop difference. After the corrected first test data signal, the corrected second test data signal and the corrected third test data signal are respectively applied to the first test pad 131, the second test pad 132 and the third test pad 133, the amplitude of the data signal at the first position 1213, the amplitude of the data signal at the third position 1223 and the amplitude of the data signal at the fourth position 1233 are matched with each other (e.g. equal to each other). Therefore, in some examples of the present disclosure, the requirements (e.g., resistance consistency or length consistency requirements) on the first test wire 111, the second test wire 112 and the third test wire 113 are reduced on the basis of ensuring or improving the brightness uniformity of the display substrate in the test stage, thereby improving the design flexibility and reducing wiring difficulty of the test wires.

As shown in FIG. 5, the bonding region 130 further includes a control signal pad 134, the peripheral region is further provided with a test control wire 114, and the test control wire 114 is connected with the control signal pad 134 and includes a transverse portion 1141 extending in the first direction D1 in the opposite region 120. As shown in FIG. 5, the opposite region 120 further includes a plurality of first group control switches 124, a plurality of second group control switches 125 and a plurality of third group control switches 126.

As shown in FIG. 5, first terminals of the plurality of first group control switches 124 are electrically connected with the plurality of first signal wires 141 of first group in one-to-one correspondence, and second terminals of the plurality of first group control switches 124 are electrically connected with the first leading wire 121; third terminals (i.e. control terminals) of the plurality of first group control switches 124 are electrically connected with the transverse portion 1141 of the test control wire 114 to control the turning-on and turning-off of the plurality of first group control switches 124 based on a control signal applied to the control signal pad 134, thereby controlling whether or not the first test data signal applied to the first test pad 131 is applied to the plurality of first signal wires 141 of first group via the first test wire 111 and the first leading wire 121.

As shown in FIG. 5, first terminals of the plurality of second group control switches 125 are electrically connected with the plurality of first signal wires 142 of second group in one-to-one correspondence, and second terminals of the plurality of second group control switches 125 are electrically connected with the second leading wire 122; third terminals (i.e. control terminals) of the plurality of second group control switches 125 are electrically connected with the transverse portion 1141 of the test control wire 114 to control the turning-on and turning-off of the plurality of second group control switches 125 based on the control signal applied to the control signal pad 134, thereby controlling whether or not the second test data signal applied to the second test pad 132 is applied to the plurality of first signal wires 142 of second group via the second test wire 112 and the second leading wire 122.

As shown in FIG. 5, first terminals of the plurality of third group control switches 126 are electrically connected with the plurality of first signal wires 143 of third group in one-to-one correspondence, and second terminals of the plurality of third group control switches 126 are electrically connected with the third leading wire 123; third terminals (i.e. control terminals) of the plurality of third group control switches 126 are electrically connected with the transverse portion 1141 of the test control wire 114 to control the turning-on and turning-off of the plurality of third group control switches 126 based on the control signal applied to the control signal pad 134, thereby controlling whether or not the third test data signal applied to the third test pad 133 is applied to the plurality of first signal wires 143 of third group via the third test wire 113 and the third leading wire 123.

For example, the control switches 124 to 126 are transistors, such as N-type transistors or P-type transistors; one of the first terminal and the second terminal of the transistor is a source electrode, the other of the first terminal and the second terminal of the transistor is a drain electrode, and the third terminal is a gate electrode. The transistors serving as the control switches 124 to 126 are for example formed together with transistors in the display sub-pixels in the display region in a process of preparing the display substrate, thereby simplifying the preparation process. For example, a display device including the display substrate 100 shown in FIG. 5 performs normal display, an invalid signal (i.e. a level signal that enables the control switches to be turned off) is applied to the control signal pad 134 to enable the control switches to be turned off, whereby adverse effects of the first test wire 111, the second test wire 112 and the third test wire 113 on the normal display of the display device are avoided.

It should be noted that according to actual application requirements, the display substrate 100 provided by some embodiments of the present disclosure for example is not provided with the control switches, the control signal pad and the control wire. In this case, for example, the first leading wire 121, the second leading wire 122 and the third leading wire 123 which are located in the opposite region 120 are removed by cutting after the test of the display substrate 100 is completed, which will not be described in detail here.

For example, in testing the display substrate 100 (e.g., in a liquid crystal cell test), the test data signal is applied to at least one selected from the group consisting of the first test pad 131, the second test pad 132 and the third test pad 133, an effective signal (i.e. a level signal that enables the control switches to be turned on) is applied to the control signal pad 134 to enables the control switches to be turned on, so that the test data signal applied to at least one selected from the group consisting of the first test pad 131, the second test pad 132 and the third test pad 133 is transmitted to the corresponding first signal wires (i.e. data wires); the gate scan signal is applied to the scan signal pad, so that the test data signal transmitted to the corresponding first signal wires (i.e. data wires) drives the corresponding display sub-pixels to emit light.

As shown in FIG. 5, the first test pad 131 and the second test pad 132 are located on one side of the display region 140 in the first direction D1 and the third test pad 133 and the control signal pad 134 are located on the other side of the display region 140 in the first direction D1. For example, respectively arranging the first test pad 131, the second test pad 132 and the third test pad 133 on two sides of the display region 140 in the first direction D1 satisfies wiring requirements (e.g., small wiring space) of a specific display substrate 100 (e.g., GOA-based display substrate 100) and/or increase the selection range of a test equipment (e.g., lower requirements on the number of test signal channels of the test equipment).

For example, the first test wire 111 and the second test wire 112 extend from the bonding region 130 (e.g., a lower left corner of the display substrate 100) to a middle region of the opposite region 120, the third test wire 113 extends from the bonding region 130 (e.g., a lower right corner of the display substrate 100) to the middle region of the opposite region 120, and the test control wire 114 extends from the bonding region 130 (e.g., the lower right corner of the display substrate 100) to the left side of the opposite region 120 (e.g., an upper left corner of the display substrate 100).

Figure 10:
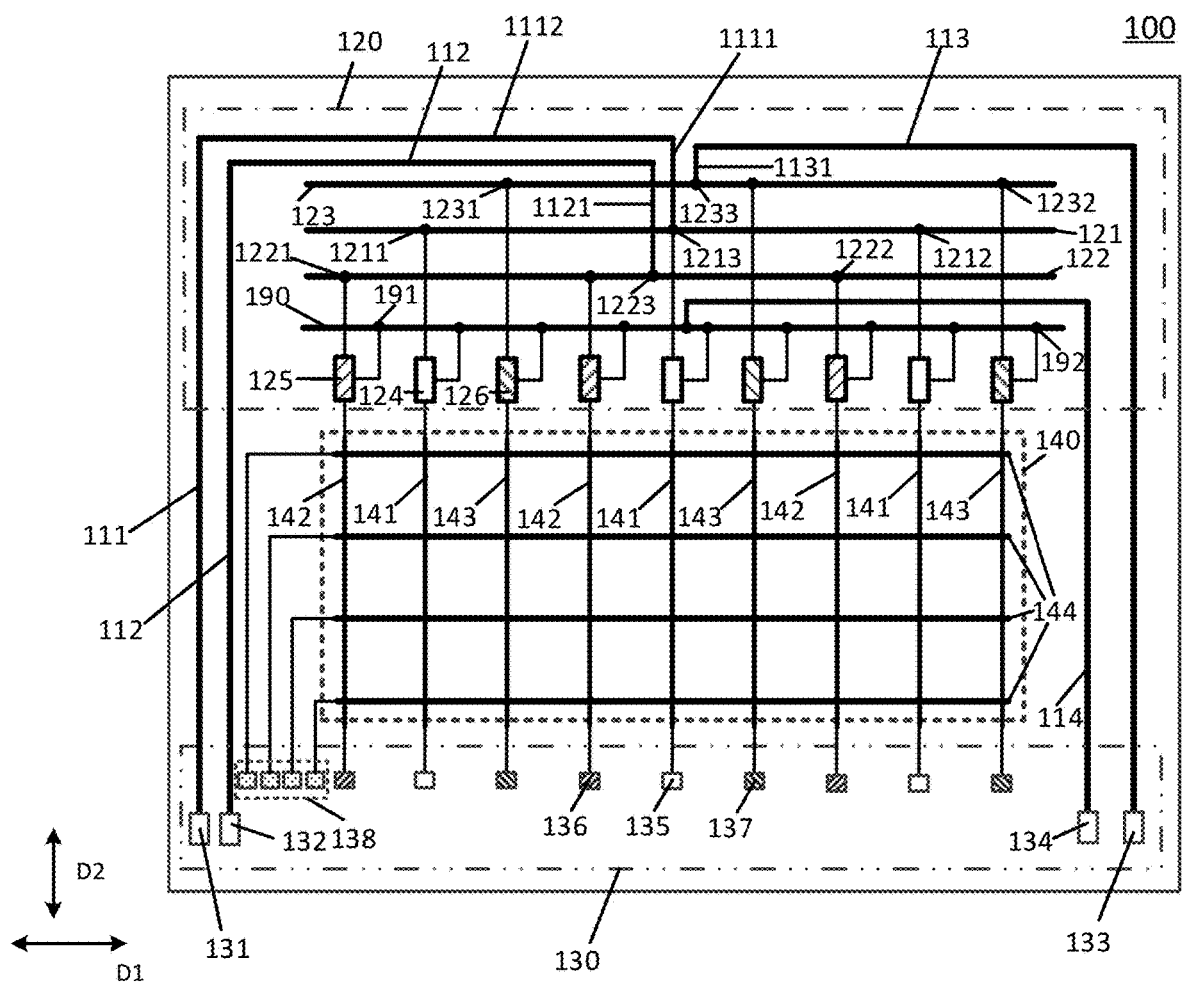
FIG. 10 is another schematic plan view of the display substrate provided by some embodiments of the present disclosure.

In some examples, the display substrate 100 further includes a control leading wire 190. As shown in FIG. 10, the test control wire 114 extends from the bonding region 130 (e.g., the lower right corner of the display substrate 100) to the middle region of the opposite region 120. In this case, the control leading wire 190 includes a seventh end 191 and an eighth end 192, and the test control wire 114 is connected with the control leading wire 190 at a connection position of the control leading wire 190 between the seventh end 191 and the eighth end 192. Here, the seventh end 191 and the eighth end 192 refer to positions of the control leading wire 190 where the control leading wire 190 is connected with the two outermost control switches among the plurality of control switches 124-126 in the first direction D1, and the seventh end 191 and the eighth end 192 may be or may be not physical ends of the control leading wire 190. For example, by setting the control leading wire 190, the time delay of the control signal (i.e. the effective signal and the invalid signal) received by different control switches is reduced, thereby making the brightness changes of the display sub-pixels located at different positions more consistent and improving the instantaneous brightness uniformity of the display substrate.

For example, the specific design of the control leading wire 190 and the connection relationship between the test control wire 114 and the control leading wire 190 are designed with reference to the first leading wire 121 and the first test wire 111 and will not be described here again. For example, the control leading wire 190 is located in the opposite region 120 and is in parallel with the first leading wire 121, the second leading wire 122 and the third leading wire 123.

For example, the first position 1213 is the "midpoint of resistance" of the first leading wire 121 between the first end 1211 and the second end 1212 (hereinafter referred to as the resistance midpoint of the first leading wire 121). In the embodiments of the present disclosure, "resistance midpoint" refers to a position which is between two points of a wire and which enables that the resistance from the position to one of the two points is equal to the position to the other of the two points; similarly, the "⅓ resistance point" mentioned in the following description refers to a position which is between two points (i.e. a starting point and an ending point) of the wire and which enables that a resistance from the position to the starting point is equal to ⅓ of a resistance from the starting point to the ending point of the wire, and the "⅔ resistance point" refers to a position which is between two points (i.e. a starting point and an ending point) of the wire and which enables that a resistance from the position to the starting point is equal to ⅔ of a resistance from the starting point to the ending point of the wire.

For example, the first position 1213 is the "resistance midpoint", the amplitude of the voltage signal at the first end 1211 is equal to the amplitude of the voltage signal at the second end 1212, and the maximum voltage drop of the first leading wire 121 is the difference between the amplitude of the voltage signal at the first position 1213 and the amplitude of the voltage signal at the first end 1211 (or at the second end 1212). Therefore, the maximum voltage drop of the first leading wire 121 of the display substrate 100 shown in FIG. 5 is half of the maximum voltage drop of the first portion of the first test wire 511 of the display substrate 500 shown in FIG. 1. Moreover, the voltage drop of the first leading wire 121 of the display substrate 100 shown in FIG. 5 is symmetrically distributed with respect to the first position 1213. In the following, exemplary descriptions are given with reference to FIGS. 6 and 7.

Figure 6:
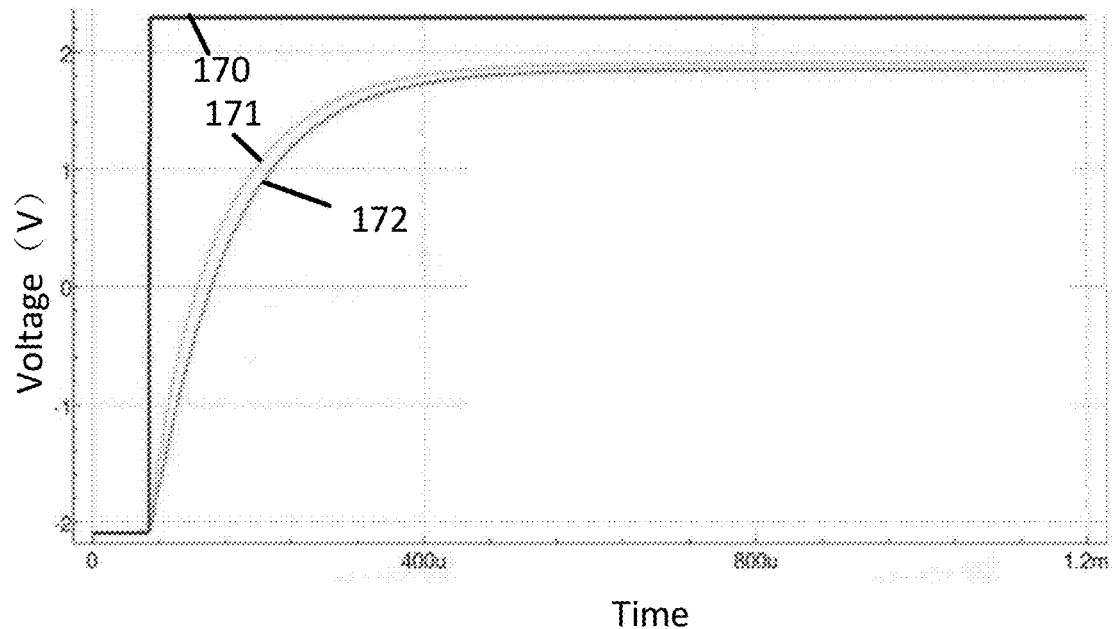
FIG. 6 shows curves illustrating that voltage signals at first and second ends of a first leading wire of the display substrate shown in FIG. 5 change with time.

FIG. 6 shows simulation curves illustrating that voltage signals of the first end 1211 and the second end 1212 of the first leading wire 121 of the display substrate 100 shown in FIG. 5 change with time. The horizontal axis of FIG. 6 represents time, where u represents microseconds and m represents milliseconds; the vertical axis of FIG. 6 represents the amplitude of the voltage signal.

Figure 7:
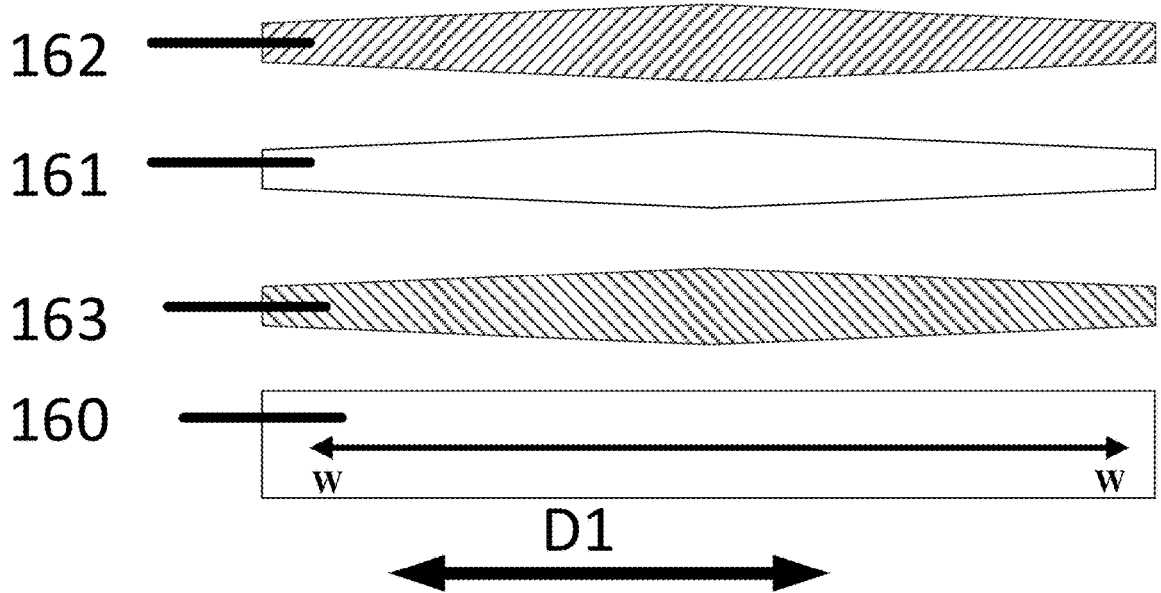
FIG. 7 shows diagrams illustrating brightness distributions of first display sub-pixels, second display sub-pixels and third display sub-pixels of the display substrate shown in FIG. 5 and a color and brightness distribution of display pixels of the display substrate shown in FIG. 5.

FIG. 7 shows a brightness distribution map 161 of the first display sub-pixels in the first direction D1, a brightness distribution map 162 of the second display sub-pixels in the first direction D1 and a brightness distribution map 163 of the third display sub-pixels in the first direction D1, where the dimension of the brightness distribution map in the longitudinal direction indicates the brightness of the display sub-pixel corresponding to the brightness distribution map.

As shown in FIG. 6, a square wave pulse 170 is applied to the first test pad 131, the steepness of the rising edge of the voltage signal 171 at the first end 1211 of the first leading wire 121 and the steepness of the rising edge of the voltage signal 172 at the second end 1212 of the first leading wire 121 have a good matching degree (i.e., are substantially the same), and the amplitude of the voltage signal 171 at the first end 1211 of the first leading wire 121 and the amplitude of the voltage signal 172 at the second end 1212 of the first leading wire 121 have a good matching degree (i.e., are substantially equal), which indicates that the first end 1211 of the first leading wire 121 and the second end 1212 of the first leading wire 121 have similar voltage drop and time delay, whereby the display substrate 100 shown in FIG. 5 reduces the maximum voltage drop of the first leading wire 121. For example, as shown in FIG. 6, the rising time of the rising edge of the voltage signal 171 at the first end 1211 of the first leading wire 121 is about 199 microseconds, and the rising time of the rising edge of the voltage signal 172 at the second end 1212 of the first leading wire 121 is about 211 microseconds, that is, a difference therebetween is only 12 microseconds. The difference between the amplitude of the voltage signal 171 at the first end 1211 of the first leading wire 121 and the amplitude of the voltage signal 172 at the second end 1212 of the first leading wire 121 is only about 53 millivolts. For example, the signals of the second leading wire 122 and the signals of the third leading wire 123 have similar voltage drop characteristics and time delay characteristics as the first leading wire 121 and will not be described here again.

For example, the amplitude of the voltage signal of the first leading wire 121 increases first and then decreases along the first direction D1 (that is, the amplitude of the voltage signal at the first position 1213 of the first leading wire 121 is the largest, and the amplitude of the voltage signal gradually decreases from the first position 1213 to two sides of the first position 1213), and the phase delay of the voltage signal of the first leading wire 121 decreases first and then increases along the first direction D1. Correspondingly, in the first direction D1, the luminous brightness of the first sub-pixels increases first and then decreases (see FIG. 7).

For example, by allowing the amplitude of the voltage signal of the first leading wire 121 to increase first and then decrease along the first direction D1, the maximum voltage drop of the first leading wire 121 is reduced, whereby the brightness difference between the first display sub-pixels in the first direction D1 in the display substrate 100 shown in FIG. 5 is reduced, that is, at the same time, the brightness difference between the first display sub-pixel having the maximum brightness and the first display sub-pixel having the minimum brightness decreases. This improves the brightness uniformity of the display substrate 100, thereby reducing missed detection caused by brightness nonuniformity caused by the design of the test wires of the display substrate 100 and improving the defect detection rate in the test stage of the display substrate.

For example, the third position 1223 is a midpoint of resistance between the third end 1221 and the fourth end 1222 of the second leading wire 122 (hereinafter referred to as a resistance midpoint of the second leading wire 122), and the fourth position 1233 is a midpoint of resistance between the fifth end 1231 and the sixth end 1232 of the third leading wire 123 (hereinafter referred to as a resistance midpoint of the third leading wire 123). In this case, for example, the maximum voltage drop of the second leading wire 122 of the display substrate 100 shown in FIG. 5 is half of the maximum voltage drop of the second portion of the second test wire 512 shown in FIG. 1, and the maximum voltage drop of the third leading wire 123 of the display substrate 100 shown in FIG. 5 is half of the third portion of the third test wire 513 of the display substrate 500 shown in FIG. 1, the voltage drop of the second leading wire 122 of the display substrate 100 shown in FIG. 5 is symmetrically distributed with respect to the third position 1223, and the voltage drop of the third leading wire 123 is symmetrically distributed with respect to the fourth position 1233.

For example, the amplitude of the voltage signal of the second leading wire 122 and the amplitude of the voltage signal of the third leading wire 123 increase first and then decrease along the first direction D1, and the phase delay of the voltage signal of the second leading wire 122 and the third leading wire 123 decreases first and then increases along the first direction D1. Correspondingly, in the first direction D1, the luminous brightness of the second sub-pixels increases first and then decreases, and the luminous brightness of the third sub-pixels increases first and then decreases (see FIG. 7).

For example, by allowing the amplitude of the voltage signal of the second leading wire 122 and the amplitude of the voltage signal of the third leading wire 123 to increase first and then decrease along the first direction D1, the maximum voltage drop of the second leading wire 122 and the maximum voltage drop of the third leading wire 123 are reduced, whereby the brightness difference between the second display sub-pixels in the first direction D1 in the display substrate 100 shown in FIG. 5 and the brightness difference between the third display sub-pixel in the first direction D1 in the display substrate 100 shown in FIG. 5 are reduced, and the brightness uniformity of the display substrate 100 is improve, so that missed detection caused by brightness nonuniformity caused by the design of the test wires of the display substrate 100 is reduced, and the defect detection rate in the test stage of the display substrate is improved.

For example, the first leading wire 121, the second leading wire 122 and the third leading wire 123 have uniform thickness, width and material distribution, and the first resistance ratio, the second resistance ratio and the third resistance ratio are equal to each other, and the voltage drop of the first leading wire 121, the voltage drop of the second leading wire 122 and the voltage drop of the third leading wire 123 are consistent with each other and are matched with each other. Thus, the data signals received by the first display sub-pixel 1451, the second display sub-pixel 1452 and the third display sub-pixel 1453 which are in the same display pixel are matched with each other, and the luminous intensities of the first display sub-pixel 1451, the second display sub-pixel 1452 and the third display sub-pixel 1453 which are in the same display pixel of the display substrate 100 are matched with each other (for example, white light is formed by the mixing), whereby the color shift defect of the display substrate 100 is inhibited.

For example, the first position 1213 is the midpoint of resistance between the first end 1211 and the second end 1212 of the first leading wire 121 (hereinafter referred to as the resistance midpoint of the first leading wire 121), the third position 1223 is the midpoint of resistance between the third end 1221 and the fourth end 1222 of the second leading wire 122 (hereinafter referred to as the resistance midpoint of the second leading wire 122), and the fourth position 1233 is the midpoint of resistance between the fifth end 1231 and the sixth end 1232 of the third leading wire 123 (hereinafter referred to as the resistance midpoint of the third leading wire 123); further, the resistance midpoint (i.e., the first position 1213) between the first end 1211 and the second end 1212 of the first leading wire 121 is the physical midpoint between the first end 1211 and the second end 1212, the resistance midpoint (i.e., the third position 1223) between the third end 1221 and the fourth end 1222 of the second leading wire 122 is the physical midpoint between the third end 1221 and the fourth end 1222, the resistance midpoint (i.e., the fourth position 1233) between the fifth end 1231 and the sixth end 1232 of the third leading wire 123 is the physical midpoint between the fifth end 1231 and the sixth end 1232. Thus, the first display sub-pixel 1451 corresponding to the resistance midpoint of the first leading wire 121, the second display sub-pixel 1452 corresponding to the resistance midpoint of the second leading wire 122 and the third display sub-pixel 1453 corresponding to the resistance midpoint of the third leading wire 123 are located in the same display pixel of the display substrate 100.

FIG. 7 also shows a distribution diagram 160 of color displayed by the display substrate 100 along the first direction D1, assuming here that the first display sub-pixel 1451, the second display sub-pixel 1452 and the third display sub-pixel 1453 emit green light, red light and blue light, respectively.

Because the voltage drop of the first leading wire 121, the voltage drop of the second leading wire 122 and the voltage drop of the third leading wire 123 are consistent and match each other, the luminous intensity of the first display sub-pixel 1451, the luminous intensity of the second display sub-pixel 1452 and the luminous intensity of the third display sub-pixel 1453 of the same display pixel of the display substrate 100 match each other. For example, in the case that the first leading wire 121, the second leading wire 122 and the third leading wire 123 are respectively applied with the data signal with a value of 255 (the value range is 0-255), the emitted red light, the emitted green light and the emitted blue light are mixed to form white light, as shown in the distribution diagram 160 of FIG. 7. Thus, the color shift defect of the display substrate 100 is inhibited.

For example, because the amplitude of the voltage signal from the resistance midpoint to two ends of the leading wire gradually decreases, the luminous brightness (e.g., white light brightness) of the display pixels of the display substrate 100 in the first direction D1 gradually decreases from the position corresponding to the resistance midpoint in the display region 140 to two sides of the display region 140 (i.e. two sides in the first direction D1).

For example, because the display substrate 100 shown in FIG. 5 can inhibit the color shift defect of the display substrate 100, missed detection caused by color shift that is caused by the design of the test wires of the display substrate 100 is reduced, and the defect detection rate at the test stage of the display substrate is further improved.

It should be noted that the first position 1213 is not limited to the resistance midpoint between the first end 1211 and the second end 1212 of the first leading wire 121. The first position 1213 may be any other position between the first end 1211 and the second end 1212 of the first leading wire 121. In this case, the corresponding display substrate 100 also has a certain technical effect of reducing brightness difference. Similarly, the third position 1223 may be any other position between the third end 1221 and the fourth end 1222 of the second leading wire 122, the fourth position 1233 may be any other position between the fifth end 1231 and the sixth end 1232 of the third leading wire 123, and the corresponding display substrate 100 also has a certain technical effect of reducing brightness difference.

It should be noted that the first resistance ratio, the second resistance ratio and the third resistance ratio are not limited to being equal to each other. According to actual application requirements, the first resistance ratio, the second resistance ratio and the third resistance ratio may have certain differences. In this case, the display substrate 100 shown in FIG. 5 has certain color shift, but the color shift of the display substrate 100 shown in FIG. 5 is still weaker than that of the display substrate 500 shown in FIG. 1.

It should be noted that the first test pad 131, the second test pad 132 and the third test pad 133 are not limited to be respectively disposed on two sides of the display region 140 in the first direction D1. According to actual application requirements, the first test pad 131, the second test pad 132 and the third test pad 133 for example are disposed on the same side of the display region 140 in the first direction D1. In this case, by providing the first leading wire 121, the second leading wire 122 and the third leading wire 123, the brightness difference of the display substrate 100 in the first direction D1 is also reduced, and the brightness uniformity of the display substrate 100 is improved, whereby the missed detection caused by the brightness nonuniformity of the display substrate is reduced, and the defect detection rate in the test stage of the display substrate is improved.

For example, the display substrate 100 is applied to a liquid crystal display panel, the display substrate 100 is an array substrate; in the second direction, the size of the array substrate is larger than the size of the color filter substrate opposite to the array substrate, and the bonding region 130 is located in a region of the array substrate where the array substrate does not overlap the color filter substrate (i.e., a region of the array substrate where the array substrate is exposed by the color film substrate), so that the test data signals are applied to the first test pad 131, the second test pad 132 and the third test pad 133 in the test of the display substrate, and the first signal wires and the second signal wires are respectively connected with the gate driver and the data driver in a subsequent process In other examples, the first test wire 111 is further electrically connected with the first leading wire 121 at a second position 1214 of the first leading wire 121, the second position 1214 is located between the first end 1211 and the second end 1212 and is different from the first position 1213, thereby further reducing the brightness difference between the first display sub-pixels along the first direction D1, improving the brightness uniformity of the display substrate 100 and the defect detection rate of the display substrate in the test stage.

For example, the first position 1213 and the second position 1214 are respectively located at the ⅓ resistance point and the ⅔ resistance point between the first end 1211 and the second end 1212 of the first leading wire 121, thereby further reducing the brightness difference between the first display sub-pixels along the first direction D1, improving the brightness uniformity of the display substrate 100 and the defect detection rate of the display substrate in the test stage. The following is an exemplary explanation of the first test wire 111 shown in FIG. 8.

Figure 8:
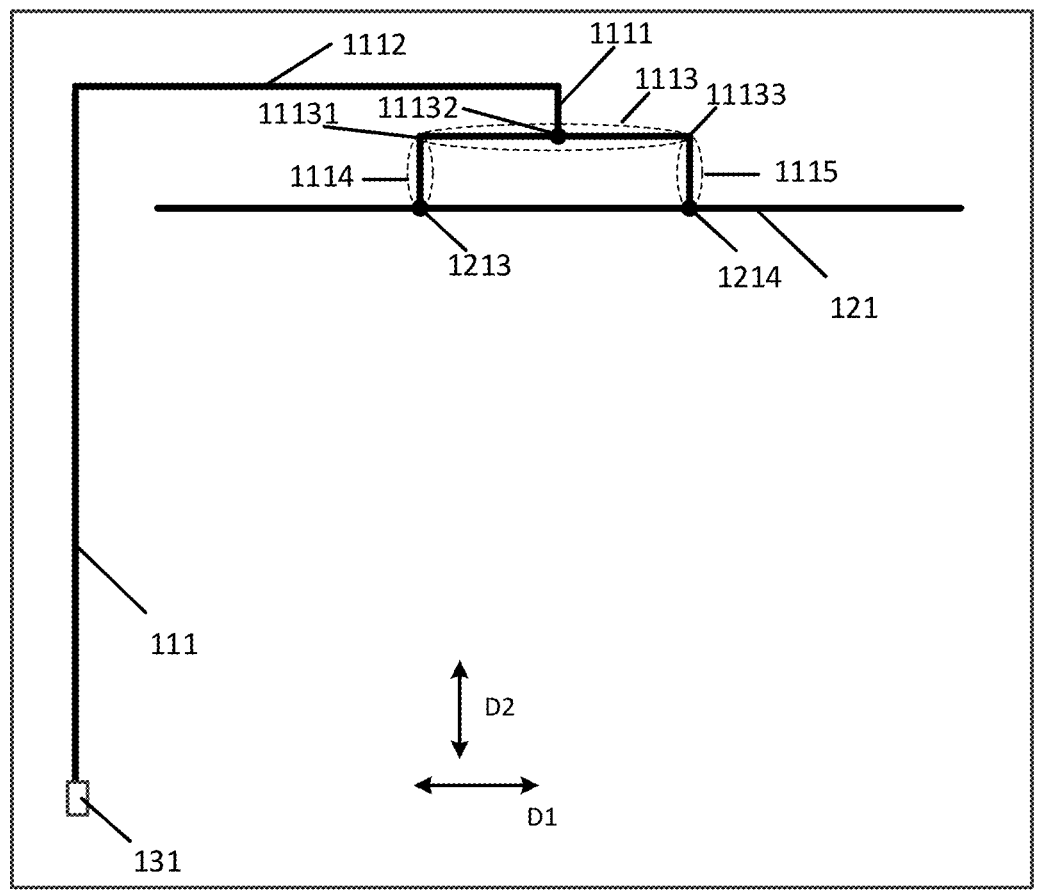
FIG. 8 illustrating another structures of a first test wire and the first leading wire provided by some embodiments of the present disclosure.

As shown in FIG. 8, the first test wire 111 further includes a first sub-wire 1113, a second sub-wire 1114 and a third sub-wire 1115, in addition to the first portion 1111 extending in the second direction D2 and the first extension portion 1112 which extends from the first test pad 131 to an end of the first portion 1111 and is connected with the end of the first portion 1111. In FIG. 8, the line segment enclosed by an upper dashed line frame is the first sub-wire 1113, the line segment enclosed by a left dashed line frame is the second sub-wire 1114, and the line segment enclosed by a right dashed line frame is the third sub-wire 1115.

As shown in FIG. 8, the first sub-wire 1113 extends in the first direction D1 and includes a first end 11131 of the first sub-wire 1113, a second end 11133 of the first sub-wire 1113 and a first position 11132 of the first sub-wire 1113. The other end of the first portion 1111 is connected with the first sub-wire 1113 at the first position 11132 of the first sub-wire 1113; one end of the second sub-wire 1114 is connected with the first end 11131 of the first sub-wire 1113, and the other end of the second sub-wire 1114 is connected with the first position 1213 of the first leading wire 121. One end of the third sub-wire 1115 is connected with the second end 11133 of the first sub-wire 1113, and the other end of the third sub-wire 1115 is connected with the second position 1214 of the first leading wire 121.

For example, the first position 11132 of the first sub-wire 1113 is the resistance midpoint of the first sub-wire 1113 between the first end 11131 of the first sub-wire 1113 and the second end 11133 of the first sub-wire 1113, whereby the amplitude of the voltage signal at the first end 11131 of the first sub-wire 1113 and the amplitude of the voltage signal at the second end 11133 of the first sub-wire 1113 are equal to each other. For example, the resistance of the second sub-wire 1114 and the resistance of the third sub-wire 1115 are equal, so that the amplitude of the voltage signal at the first position 1213 of the first leading wire 121 is equal to the amplitude of the voltage signal at the second position 1214 of the first leading wire 121, and the maximum voltage drop of the first leading wire 121 shown in FIG. 8 is ⅓ of the maximum voltage drop of the first portion of the first test wire 511 of the display substrate 500 shown in FIG. 1. In other embodiments, the first sub-wire 1113 is electrically connected with the first leading wire 121 at more (more than or equal to 3) positions of the first leading wire 121, so that the difference in voltage drop of the first leading wire 121 is smaller.

For example, the first test wire 111 and the first leading wire 121 shown in FIG. 8 are applied to the display substrate 100 shown in FIG. 5, the difference in the amplitude and phase delay among the voltage signals of the first leading wire 121 is further reduced, thus the brightness difference of the display substrate 100 along the first direction D1 is further reduced, and the brightness uniformity of the display substrate 100 is improved, whereby the missed detection caused by the brightness nonuniformity of the display substrate 100 is further reduced, and the defect detection rate in the display substrate test stage is improved.

For example, according to actual application requirements, the first test wire 111 is electrically connected with the first leading wire 121 at more positions of the first leading wire 121. For example, the first test wire 111 is electrically connected with the first leading wire 121 at ⅕ resistance point, ⅖ resistance point, ⅗ resistance point and ⅘ resistance point of the first leading wire 121, which are between the first end 1211 and the second end 1212, thereby further improving the brightness uniformity of the display substrate 100 and the defect detection rate in the test stage of the display substrate, which will not be repeated here.

It should be noted that the design similar to that shown in FIG. 8 is applicable to the second test wire 112 and the second leading wire 122, and the third test wire 113 and the third leading wire 123 of the display substrate 100 shown in FIG. 5, thereby further reducing the difference in the amplitude and phase delay of voltage signal of the second leading wire 122 and reducing the difference in the amplitude and phase delay of voltage signal of the third leading wire 123, and thus further reducing the brightness difference of the display substrate 100 in the first direction D1 and improving the defect detection rate of the display substrate in the test stage.

It should be noted that, for the sake of clarity, the above embodiments mainly explain the effect of reduction in the amplitude difference of the voltage signal of the leading wire (e.g., the first leading wire 121) of the display substrate 100 on improving the brightness uniformity of the display substrate 100 and inhibiting color shift. However, the reduction in the time delay difference of the voltage signal of the leading wire also plays a role in improving the brightness uniformity of the display substrate 100 and inhibiting color shift, which will not be repeated here.

At least one embodiment of the present disclosure further provides a display device including the display substrate 100 provided in any one of the embodiments of the present disclosure.

Figure 9:
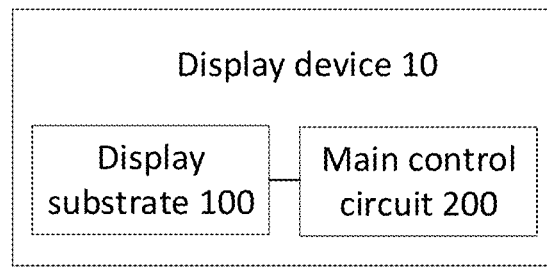
FIG. 9 is an exemplary block diagram of a display device provided by some embodiments of the present disclosure.

FIG. 9 shows a display device 10 provided by some embodiments of the present disclosure. As shown in FIG. 9, the display device 10 includes the display substrate 100 provided in any one of the embodiments of the present disclosure and a main control circuit 200, and the display substrate 100 is electrically connected with the main control circuit 200. For example, under the control of the main control circuit 200, the display substrate 100 realizes a display function. For example, the performance of the display substrate 100 is tested under the control of the main control circuit 200. For example, the main control circuit 200 is a central processor unit.

It should be noted that the components of the main control circuit (e.g., power supply circuit, image data encoding/decoding device, gate driver, data driver, clock circuit, etc.) may adopt suitable conventional components, which are not described in detail herein and should not be taken as limitations to the embodiments of the present disclosure. For example, the display device 10 according to the embodiments of the present disclosure is a product or component having a display function such as a mobile phone, a tablet computer, a television, a display, a notebook computer, a digital camera, a navigator, etc.

Some embodiments of the present disclosure further provide a test method for the above-mentioned display substrate, and the test method includes: applying a first signal to the plurality of first signal wires of first group via the first test wire and the first leading wire, and performing a detection based on a display state of the display substrate.

Taking the display substrate shown in FIG. 5 as an example, the test method of the display substrate provided by at least one embodiment of the present disclosure will be described by way of example.

For example, the test method of the display substrate includes at least one of steps S101- to S103.

Step S101: applying the first signal to the plurality of first signal wires of first group via the first test wire and the first leading wire and performing the detection based on the display state of the display substrate.

Step S102: applying a second signal to the plurality of first signal wires of second group via the second test wire and the second leading wire and perform the detection based on the display state of the display substrate.

Step S103: applying a third signal to the plurality of first signal wires of third group via the third test wire and the third leading wire and performing the detection based on the display state of the display substrate.

For example, in step S101, the first signal (i.e., the test data signal) is applied to the first test pad, and the effective signal (e.g., the level signal that enables the control switches to be turned on) is applied to the control signal pad, so that the test data signal applied to the first test pad is transmitted to the plurality of first signal wires of first group; and the gate scan signal is applied to the scan signal pad, so that the first signal transmitted to the plurality of first signal wires of first group drives the corresponding first display sub-pixels to emit light. Then, the detection is performed based on a luminous state of the first display sub-pixels. For example, it is determined whether there is a defect, such as the brightness nonuniformity defect (MURA), in the display region itself of the display substrate based on the luminous state of the plurality of first display sub-pixels in the display region. For another example, it is determined whether there is a bright spot defect or a dark spot defect in the display region itself of the display substrate based on whether there is the first display sub-pixel with zero brightness or low brightness in an all-white test.

For example, the specific processes of step S102 and step S103 are similar to step S101 and will not be repeated here. For example, at least one of steps S101 to S103 is performed according to requirements in testing the display substrate. In the case that a plurality of processes are performed in each of the steps S101 to S103, the plurality of processes are performed sequentially or simultaneously, and an exemplary explanation will be given below in order to perform steps S101 to S103 simultaneously.

For example, the steps S101 to S103 are simultaneously performed, the first signal, the second signal and the third signal are respectively applied to the first test pad, the second test pad and the third test pad, and the effective signal (i.e. the level signal that enables the control switches to be turned on) is applied to the control signal pad to enable the control switches to be turned on, so that the first signal, the second signal and the third signal which are respectively applied to the first test pad, the second test pad and the third test pad are transmitted to corresponding first signal wires; and the gate scan signal is applied to the scan signal pad, so that the signals transmitted to the corresponding first signal wires drives the corresponding display sub-pixels to emit light. In this case, for example, whether there is the color shift in the display region of the display substrate is detected.

Because the display substrate provided by some embodiments of the present disclosure reduces brightness difference and/or color shift caused by the test wires of the display substrate, missed detection caused by the test wires of the display substrate is reduced, and the defect detection rate in the test stage of the display substrate is improved.

What are described above is related to the illustrative embodiments of the disclosure only and not limitative to the scope of the disclosure; the scopes of the disclosure are defined by the accompanying claims.

What is claimed is:

1. A display substrate, comprising a display region and a peripheral region disposed outside the display region, wherein the peripheral region is provided with a first leading wire continuously extending in a first direction, and the first leading wire comprises a first end and a second end;

the peripheral region is further provided with a first test wire, the first test wire is electrically and directly connected with the first leading wire at a first position of the first leading wire, and the first position is between the first end and the second end and is different from the first end and the second end;

the display region comprises a plurality of first signal wires of a first group which extend in a second direction different from the first direction and which are parallel to each other;

for two first signal wires arranged outermost in the first direction among the plurality of first signal wires of the first group, one is directly connected with the first leading wire at the first end and the other is directly connected with the first leading wire at the second end;

remaining first signal wires among the plurality of first signal wires of the first group are directly connected with the first leading wire at positions provided between the first end and the second end and different from the first end and the second end, the peripheral region is further provided with a second leading wire continuously extending in the first direction, and the second leading wire comprises a third end and a fourth end;

the peripheral region is further provided with a second test wire, the second test wire is electrically and directly connected with the second leading wire at a third position of the second leading wire, and the third position is between the third end and the fourth end and is different from the third end and the fourth end;

the display region further comprises a plurality of the first signal wires of a second group which extend in the second direction and which are parallel to each other;

for two first signal wires arranged outermost in the first direction among the plurality of first signal wires of the second group, one is directly connected with the second leading wire at the third end and the other is directly connected with the second leading wire at the fourth end;

remaining first signal wires among the plurality of first signal wires of the second group are directly connected with the second leading wire at positions provided between the third end and the fourth end and different from the third end and the fourth end;

the peripheral region is further provided with a third leading wire continuously extending in the first direction, and the third leading wire comprises a fifth end and a sixth end;

the peripheral region is further provided with a third test wire, the third test wire is electrically and directly connected with the third leading wire at a fourth position of the third leading wire, and the fourth position is between the fifth end and the sixth end and is different from the fifth end and the sixth end;

the display region further comprises a plurality of the first signal wires of a third group which extend in the second direction and which are parallel to each other;

for two first signal wires arranged outermost in the first direction among the plurality of first signal wires of the third group, one is directly connected with third leading wire at the fifth end and the other is directly connected with the third leading wire at the sixth end;

remaining first signal wires among the plurality of first signal wires of the third group are directly connected with the third leading wire at positions provided between the fifth end and the sixth end and different from the fifth end and the sixth end;

the plurality of first signal wires of the first group, the plurality of first signal wires of the second group, and the plurality of first signal wires of the third group are respectively configured for transmitting data signals for sub-pixels for displaying light of different colors; and for three adjacent wires of one first signal wire of the first group, one first signal wire of the second group, and one first signal wire of the third group, a connection position where the one first signal wire of the second group is directly connected with the second leading wire, a connection position where the one first signal wire of the first group is directly connected with the first leading wire, and a connection position where the one first signal wire of the third group is directly connected with the third leading wire are sequentially arranged in the first direction and are immediately adjacent to each other.

2. The display substrate as claimed in claim 1, wherein the first position is a resistance midpoint of the first leading wire between the first end and the second end.

3. The display substrate as claimed in claim 1, wherein the first test wire is further electrically connected with the first leading wire at a second position of the first leading wire, and the second position is between the first end and the second end and is different from the first position.

4. The display substrate as claimed in claim 3, wherein the first position and the second position are respectively at a ⅓ resistance point and a ⅔ resistance point of the first leading wire between the first end and the second end.

5. The display substrate as claimed in claim 1, wherein
the display region further comprises a plurality of second signal wires which extend in the first direction and which are parallel to each other;
the plurality of second signal wires cross with and are insulated from the plurality of first signal wires of the first group; and
the first leading wire and the plurality of second signal wires are in a same layer.

6. The display substrate as claimed in claim 5, wherein
the first test wire comprises a first portion extending in the second direction and a first extension portion other than the first portion, one end of the first portion is electrically connected with the first leading wire, and the other end of the first portion is electrically connected with the first extension portion;
the first portion and the plurality of first signal wires of the first group are in a same layer; and
the first extension portion, the first leading wire, and the plurality of second signal wires are in a same layer.

7. The display substrate as claimed in claim 1, wherein
the peripheral region comprises a bonding region and an opposite region;
the bonding region and the opposite region are respectively positioned at two sides of the display region along the second direction; and
the first leading wire is in the opposite region.

8. The display substrate as claimed in claim 7, wherein the bonding region comprises a first test pad, one end of the first test wire is electrically connected with the first test pad, and the other end of the first test wire is electrically connected with the first leading wire at the first position.

9. The display substrate as claimed in claim 7, wherein the bonding region comprises a plurality of first signal pads of a first group, and the plurality of first signal wires of the first group are connected with the plurality of first signal pads of the first group in one-to-one correspondence.

10. The display substrate as claimed in claim 8, wherein
the peripheral region is further provided with a test control wire,
the opposite region comprises a plurality of first group control switches, first terminals of the plurality of first group control switches are electrically connected with the plurality of first signal wires of the first group in a one-to-one correspondence, second terminals of the plurality of first group control switches are electrically connected with the first leading wire, and control terminals of the plurality of first group control switches are electrically connected with the test control wire.

11. The display substrate as claimed in claim 10, wherein the second leading wire is in the opposite region; and the bonding region further comprises a second test pad, one end of the second test wire is electrically connected with the second test pad, and the other end of the second test wire is electrically connected with the second leading wire at the third position.

12. The display substrate as claimed in claim 11, wherein the third leading wire is in the opposite region; and
the bonding region further comprises a third test pad, one end of the third test wire is electrically connected with the third test pad, and the other end of the third test wire is electrically connected with the third leading wire at the fourth position.

13. The display substrate as claimed in claim 10, wherein the opposite region is provided with a control leading wire extending in the first direction, and the control leading wire comprises a seventh end and an eighth end;
the test control wire is connected with the control leading wire at a connection position which is comprised by the control leading wire and which is between the seventh end and the eighth end; and
two control switches arranged outermost in the first direction among the plurality of first group control switches are respectively connected with the seventh end and the eighth end, and remaining control switches among the plurality of first group control switches are connected with the control leading wire between the seventh end and the eighth end.

14. The display substrate as claimed in claim 12, wherein the opposite region further comprises a plurality of second group control switches, first terminals of the plurality of second group control switches are electrically connected with the plurality of first signal wires of the second group in a one-to-one correspondence, second terminals of the plurality of second group control switches are electrically connected with the second leading wire, and control terminals of the plurality of second group control switches are electrically connected with the test control wire; and
the opposite region further comprises a plurality of third group control switches, first terminals of the plurality of third group control switches are electrically connected with the plurality of first signal wires of the third group in a one-to-one correspondence, second terminals of the plurality of third group control switches are electrically connected with the third leading wire, and control terminals of the plurality of third group control switches are electrically connected with the test control wire.

15. The display substrate as claimed in claim 12, wherein the bonding region is further provided with a control signal pad electrically connected with the test control wire,
the first test pad and the second test pad are on one side of the display region in the first direction, and the third test pad and the control signal pad are on the other side of the display region in the first direction.

16. The display substrate as claimed in claim 12, wherein a first resistance ratio, a second resistance ratio, and a third resistance ratio are equal to each other;
the first resistance ratio is a ratio of a resistance from the first end to the first position of the first leading wire to a resistance from the first position to the second end of the first leading wire;
the second resistance ratio is a ratio of a resistance from the third end to the third position of the second leading wire to a resistance from the third position to the fourth end of the second leading wire; and
the third resistance ratio is a ratio of a resistance from the fifth end to the fourth position of the third leading wire to a resistance from the fourth position to the sixth end of the third leading wire.

17. The display substrate as claimed in claim 16, wherein the first position is a resistance midpoint between the first end and the second end of the first leading wire;
the third position is a resistance midpoint between the third end and the fourth end of the second leading wire; and
the fourth position is a resistance midpoint between the fifth end and the sixth end of the third leading wire.

18. The display substrate as claimed in claim 12, wherein a resistance of the first test wire, a resistance of the second test wire, and a resistance of the third test wire are equal to each other.

19. A display device, comprising the display substrate as claimed in claim 1 and a main control circuit electrically connected with the display substrate.

* * * * *